United States Patent
Kang et al.

(10) Patent No.: US 9,685,320 B2
(45) Date of Patent: Jun. 20, 2017

(54) METHODS FOR DEPOSITING SILICON OXIDE

(71) Applicant: Lam Research Corporation, Fremont, CA (US)

(72) Inventors: Hu Kang, Tualatin, OR (US); Wanki Kim, Gyeoggi (KR); Adrien LaVoie, Newberg, OR (US)

(73) Assignee: Lam Research Corporation, Fremont, CA (US)

( * ) Notice: Subject to any disclaimer, the term of this patent is extended or adjusted under 35 U.S.C. 154(b) by 195 days.

(21) Appl. No.: 14/335,785

(22) Filed: Jul. 18, 2014

(65) Prior Publication Data

US 2016/0020092 A1 Jan. 21, 2016
US 2016/0163539 A9 Jun. 9, 2016

(51) Int. Cl.
*H01L 21/02* (2006.01)
*H01J 37/32* (2006.01)
*C23C 16/40* (2006.01)
*C23C 16/455* (2006.01)

(52) U.S. Cl.
CPC ...... *H01L 21/02274* (2013.01); *C23C 16/402* (2013.01); *C23C 16/45542* (2013.01); *H01J 37/32091* (2013.01); *H01J 37/32137* (2013.01); *H01J 37/32724* (2013.01); *H01J 37/32917* (2013.01); *H01L 21/022* (2013.01); *H01L 21/0228* (2013.01); *H01L 21/02164* (2013.01)

(58) Field of Classification Search
None
See application file for complete search history.

(56) References Cited

U.S. PATENT DOCUMENTS

| | | | |
|---|---|---|---|
| 4,500,563 | A | 2/1985 | Ellenberger et al. |
| 5,223,443 | A | 6/1993 | Chinn et al. |
| 5,496,608 | A | 3/1996 | Matsuda et al. |

(Continued)

FOREIGN PATENT DOCUMENTS

| | | |
|---|---|---|
| CN | 1732288 A | 2/2006 |
| CN | 1926668 A | 3/2007 |

(Continued)

OTHER PUBLICATIONS

U.S. Appl. No. 14/194,549, filed Feb. 28, 2014, entitled "Capped Ald Films for Doping Fin-Shaped Channel Regions of 3-D IC Transistors."

(Continued)

*Primary Examiner* — Scott B Geyer
*Assistant Examiner* — Alia Sabur
(74) *Attorney, Agent, or Firm* — Weaver Austin Villeneuve & Sampson LLP

(57) ABSTRACT

The embodiments herein focus on plasma enhanced atomic layer deposition (PEALD) processes. Conventional PEALD techniques result in films having high quality at the bottom and top of a feature, but low quality on the sidewalls. The disclosed embodiments achieve more uniform film quality as evidenced by more uniform wet etch rates and electrical properties throughout the film. The disclosed embodiments may use one or more of a relatively high deposition temperature, a relatively high RF power for generating the plasma, and/or relatively long RF plasma exposure duration during each cycle of the PEALD reaction.

23 Claims, 13 Drawing Sheets

(56) References Cited

U.S. PATENT DOCUMENTS

| | | | |
|---|---|---|---|
| 5,593,914 A | 1/1997 | Evans, Jr. et al. |
| 5,670,432 A | 9/1997 | Tsai |
| 5,856,003 A | 1/1999 | Chiu |
| 5,874,368 A | 2/1999 | Laxman et al. |
| 5,932,286 A | 8/1999 | Beinglass et al. |
| 6,069,058 A | 5/2000 | Hong |
| 6,100,202 A | 8/2000 | Lin et al. |
| 6,218,293 B1 | 4/2001 | Kraus et al. |
| 6,270,572 B1 | 8/2001 | Kim et al. |
| 6,346,741 B1 | 2/2002 | Van Buskirk et al. |
| 6,391,803 B1 | 5/2002 | Kim et al. |
| 6,416,822 B1 | 7/2002 | Chiang et al. |
| 6,428,859 B1 | 8/2002 | Chiang et al. |
| 6,468,924 B2 | 10/2002 | Lee et al. |
| 6,509,601 B1 | 1/2003 | Lee et al. |
| 6,528,430 B2 | 3/2003 | Kwan et al. |
| 6,551,893 B1 | 4/2003 | Zheng et al. |
| 6,569,501 B2 | 5/2003 | Chiang et al. |
| 6,576,053 B1 | 6/2003 | Kim et al. |
| 6,602,784 B2 | 8/2003 | Sneh |
| 6,632,478 B2 | 10/2003 | Gaillard et al. |
| 6,645,574 B1 | 11/2003 | Lee et al. |
| 6,689,220 B1 | 2/2004 | Nguyen |
| 6,723,595 B2 | 4/2004 | Park |
| 6,730,614 B1 | 5/2004 | Lim et al. |
| 6,743,738 B2 | 6/2004 | Todd |
| 6,756,318 B2 | 6/2004 | Nguyen et al. |
| 6,765,303 B1 | 7/2004 | Krivokapic et al. |
| 6,809,421 B1 | 10/2004 | Hayasaka et al. |
| 6,828,218 B2 | 12/2004 | Kim et al. |
| 6,835,417 B2 | 12/2004 | Saenger et al. |
| 6,861,356 B2 | 3/2005 | Matsuse et al. |
| 6,884,466 B2 | 4/2005 | Kaloyeros et al. |
| 6,930,058 B2 | 8/2005 | Hill et al. |
| 6,930,060 B2 | 8/2005 | Chou et al. |
| 6,943,092 B2 | 9/2005 | Kim |
| 6,962,876 B2 | 11/2005 | Ahn et al. |
| 6,987,240 B2 | 1/2006 | Jennings et al. |
| 7,001,844 B2 | 2/2006 | Chakravarti et al. |
| 7,041,335 B2 | 5/2006 | Chung |
| 7,077,904 B2 | 7/2006 | Cho et al. |
| 7,081,271 B2 | 7/2006 | Chung et al. |
| 7,109,129 B1 | 9/2006 | Papasouliotis |
| 7,115,166 B2 | 10/2006 | Vaartstra et al. |
| 7,115,528 B2 | 10/2006 | Vaartstra et al. |
| 7,122,222 B2 | 10/2006 | Xiao et al. |
| 7,122,464 B2 | 10/2006 | Vaartstra |
| 7,125,815 B2 | 10/2006 | Vaartstra |
| 7,132,353 B1 | 11/2006 | Xia et al. |
| 7,141,278 B2 | 11/2006 | Koh et al. |
| 7,148,155 B1 * | 12/2006 | Tarafdar et al. ............ 438/778 |
| 7,151,039 B2 | 12/2006 | Lee et al. |
| 7,172,792 B2 | 2/2007 | Wang et al. |
| 7,176,084 B2 | 2/2007 | Lee et al. |
| 7,205,187 B2 | 4/2007 | Leith et al. |
| 7,223,649 B2 | 5/2007 | Oh et al. |
| 7,235,484 B2 | 6/2007 | Nguyen et al. |
| 7,241,686 B2 | 7/2007 | Marcadal et al. |
| 7,244,668 B2 | 7/2007 | Kim |
| 7,250,083 B2 | 7/2007 | Sneh |
| 7,259,050 B2 | 8/2007 | Chen et al. |
| 7,261,919 B2 | 8/2007 | Mehregany et al. |
| 7,294,582 B2 | 11/2007 | Haverkort et al. |
| 7,297,641 B2 | 11/2007 | Todd et al. |
| 7,300,885 B2 | 11/2007 | Hasebe et al. |
| 7,314,835 B2 | 1/2008 | Ishizaka et al. |
| 7,341,959 B2 | 3/2008 | Brcka |
| 7,351,668 B2 | 4/2008 | Chou et al. |
| 7,361,538 B2 | 4/2008 | Luan et al. |
| 7,361,611 B2 | 4/2008 | Chakravarti et al. |
| 7,390,743 B2 | 6/2008 | Shin |
| 7,393,561 B2 | 7/2008 | Paranjpe |
| 7,399,388 B2 | 7/2008 | Moghadam et al. |
| 7,419,888 B2 | 9/2008 | Yang et al. |
| 7,435,454 B2 | 10/2008 | Brcka |
| 7,435,684 B1 | 10/2008 | Lang et al. |
| 7,462,571 B2 | 12/2008 | Hasebe et al. |
| 7,482,247 B1 | 1/2009 | Papasouliotis et al. |
| 7,488,694 B2 | 2/2009 | Kim et al. |
| 7,507,676 B2 | 3/2009 | Chou et al. |
| 7,510,984 B2 | 3/2009 | Saito et al. |
| 7,521,331 B2 | 4/2009 | Park et al. |
| 7,524,762 B2 | 4/2009 | Marcadal et al. |
| 7,544,615 B2 | 6/2009 | Vaartstra |
| 7,572,052 B2 | 8/2009 | Ravi et al. |
| 7,592,231 B2 | 9/2009 | Cheng et al. |
| 7,595,010 B2 | 9/2009 | Chakravarti et al. |
| 7,601,648 B2 | 10/2009 | Chua et al. |
| 7,615,438 B2 | 11/2009 | Ahn et al. |
| 7,615,449 B2 | 11/2009 | Chung et al. |
| 7,622,369 B1 | 11/2009 | Lee et al. |
| 7,622,383 B2 | 11/2009 | Kim et al. |
| 7,629,267 B2 | 12/2009 | Wan et al. |
| 7,632,757 B2 | 12/2009 | Matsuura |
| 7,633,125 B2 | 12/2009 | Lu et al. |
| 7,638,170 B2 | 12/2009 | Li |
| 7,645,484 B2 | 1/2010 | Ishizaka |
| 7,651,729 B2 | 1/2010 | Kim et al. |
| 7,651,730 B2 | 1/2010 | Hasebe |
| 7,651,953 B2 | 1/2010 | Todd et al. |
| 7,651,959 B2 | 1/2010 | Fukazawa et al. |
| 7,682,657 B2 | 3/2010 | Sherman |
| 7,687,409 B2 | 3/2010 | Ahn et al. |
| 7,713,592 B2 | 5/2010 | Nguyen et al. |
| 7,758,920 B2 | 7/2010 | Hasebe et al. |
| 7,776,733 B2 | 8/2010 | Hasegawa |
| 7,790,633 B1 | 9/2010 | Tarafdar et al. |
| 7,825,039 B2 | 11/2010 | Takahashi et al. |
| 7,906,168 B2 | 3/2011 | Hasebe et al. |
| 7,919,416 B2 | 4/2011 | Lee et al. |
| 7,923,068 B2 | 4/2011 | Dickey et al. |
| 7,923,378 B2 | 4/2011 | Hasebe et al. |
| 7,959,985 B2 | 6/2011 | Ishizaka et al. |
| 7,964,241 B2 | 6/2011 | Hasebe et al. |
| 7,964,513 B2 | 6/2011 | Todd et al. |
| 7,972,980 B2 | 7/2011 | Lee et al. |
| 7,981,473 B2 | 7/2011 | Kim et al. |
| 7,989,365 B2 | 8/2011 | Park et al. |
| 8,034,673 B2 | 10/2011 | Kadonaga et al. |
| 8,080,290 B2 | 12/2011 | Hasebe et al. |
| 8,101,531 B1 | 1/2012 | Li et al. |
| 8,119,424 B2 | 2/2012 | Mather et al. |
| 8,119,544 B2 | 2/2012 | Hasebe et al. |
| 8,133,797 B2 | 3/2012 | van Schravendijk et al. |
| 8,178,448 B2 | 5/2012 | Nodera et al. |
| 8,227,032 B2 | 7/2012 | Dussarrat et al. |
| 8,257,789 B2 | 9/2012 | Matsunaga et al. |
| 8,278,224 B1 | 10/2012 | Mui et al. |
| 8,334,218 B2 | 12/2012 | Van Nooten et al. |
| 8,357,619 B2 | 1/2013 | Hasebe et al. |
| 8,366,953 B2 | 2/2013 | Kohno et al. |
| 8,383,525 B2 | 2/2013 | Raisanen et al. |
| 8,394,466 B2 | 3/2013 | Hong et al. |
| 8,524,612 B2 | 9/2013 | Li et al. |
| 8,592,328 B2 | 11/2013 | Hausmann et al. |
| 8,633,050 B2 | 1/2014 | Pierreux |
| 8,637,411 B2 | 1/2014 | Swaminathan et al. |
| 8,647,993 B2 | 2/2014 | Lavoie et al. |
| 8,669,185 B2 | 3/2014 | Onizawa et al. |
| 8,728,955 B2 | 5/2014 | LaVoie et al. |
| 8,728,956 B2 | 5/2014 | LaVoie et al. |
| 8,956,983 B2 | 2/2015 | Swaminathan et al. |
| 8,999,859 B2 | 4/2015 | Swaminathan et al. |
| 9,076,646 B2 | 7/2015 | Sims et al. |
| 9,214,334 B2 | 12/2015 | Swaminathan et al. |
| 9,230,800 B2 | 1/2016 | Lavoie et al. |
| 9,257,274 B2 | 2/2016 | Kang et al. |
| 9,287,113 B2 | 3/2016 | Kang et al. |
| 9,355,839 B2 | 5/2016 | Swaminathan et al. |
| 9,355,886 B2 | 5/2016 | Swaminathan et al. |
| 9,373,500 B2 | 6/2016 | Swaminathan et al. |
| 9,502,238 B2 | 11/2016 | Danek et al. |
| 9,564,312 B2 | 2/2017 | Henri et al. |
| 9,570,274 B2 | 2/2017 | Swaminathan et al. |

(56) References Cited

U.S. PATENT DOCUMENTS

| | | |
|---|---|---|
| 9,570,290 B2 | 2/2017 | Swaminathan et al. |
| 9,611,544 B2 | 4/2017 | Lavoie et al. |
| 2002/0076507 A1 | 6/2002 | Chiang et al. |
| 2003/0008070 A1 | 1/2003 | Seutter et al. |
| 2003/0024477 A1 | 2/2003 | Okuda et al. |
| 2003/0143839 A1 | 7/2003 | Raaijmakers et al. |
| 2003/0200917 A1 | 10/2003 | Vaartstra |
| 2004/0033698 A1 | 2/2004 | Lee et al. |
| 2004/0043633 A1 | 3/2004 | Vaartstra |
| 2004/0053515 A1 | 3/2004 | Comita et al. |
| 2004/0121164 A1 | 6/2004 | Iacovangelo et al. |
| 2004/0219746 A1 | 11/2004 | Vaartstra et al. |
| 2004/0231799 A1 | 11/2004 | Lee et al. |
| 2005/0042865 A1 | 2/2005 | Cabral et al. |
| 2005/0079661 A1 | 4/2005 | Cho et al. |
| 2005/0109276 A1 | 5/2005 | Iyer et al. |
| 2005/0118837 A1 | 6/2005 | Todd et al. |
| 2005/0159017 A1 | 7/2005 | Kim et al. |
| 2005/0181535 A1 | 8/2005 | Yun et al. |
| 2005/0184397 A1 | 8/2005 | Gates et al. |
| 2005/0196977 A1 | 9/2005 | Saito et al. |
| 2005/0208718 A1 | 9/2005 | Lim et al. |
| 2005/0230047 A1 | 10/2005 | Collins et al. |
| 2005/0233553 A1 | 10/2005 | Kountz et al. |
| 2005/0260347 A1 | 11/2005 | Narwankar et al. |
| 2005/0276099 A1 | 12/2005 | Horng et al. |
| 2005/0287775 A1 | 12/2005 | Hasebe et al. |
| 2006/0030148 A1 | 2/2006 | Seutter et al. |
| 2006/0084283 A1 | 4/2006 | Paranjpe et al. |
| 2006/0088985 A1 | 4/2006 | Haverkort et al. |
| 2006/0165890 A1 | 7/2006 | Kaushal et al. |
| 2006/0199357 A1 | 9/2006 | Wan et al. |
| 2006/0228868 A1 | 10/2006 | Ahn et al. |
| 2006/0286774 A1 | 12/2006 | Singh et al. |
| 2006/0286776 A1 | 12/2006 | Ranish et al. |
| 2006/0286818 A1 | 12/2006 | Wang et al. |
| 2007/0010071 A1 | 1/2007 | Matsuura |
| 2007/0065576 A1 | 3/2007 | Singh et al. |
| 2007/0087574 A1 | 4/2007 | Gupta et al. |
| 2007/0087581 A1 | 4/2007 | Singh et al. |
| 2007/0116887 A1 | 5/2007 | Faguet |
| 2007/0134942 A1 | 6/2007 | Ahn et al. |
| 2007/0137572 A1 | 6/2007 | Matsuura et al. |
| 2007/0145483 A1 | 6/2007 | Ono |
| 2007/0167028 A1 | 7/2007 | Chou et al. |
| 2007/0215036 A1 | 9/2007 | Park et al. |
| 2007/0218701 A1 | 9/2007 | Shimizu et al. |
| 2007/0231487 A1 | 10/2007 | Ishizaka |
| 2007/0232082 A1 | 10/2007 | Balseanu et al. |
| 2007/0251444 A1 | 11/2007 | Gros-Jean et al. |
| 2007/0259110 A1 | 11/2007 | Mahajani et al. |
| 2008/0014759 A1 | 1/2008 | Chua et al. |
| 2008/0038936 A1 | 2/2008 | Todd et al. |
| 2008/0063791 A1 | 3/2008 | Hasebe et al. |
| 2008/0075881 A1 | 3/2008 | Won et al. |
| 2008/0081470 A1 | 4/2008 | Clark |
| 2008/0087890 A1 | 4/2008 | Ahn et al. |
| 2008/0123394 A1 | 5/2008 | Lee et al. |
| 2008/0131601 A1 | 6/2008 | Kim et al. |
| 2008/0138996 A1 | 6/2008 | Nishizuka |
| 2008/0139003 A1 | 6/2008 | Pirzada et al. |
| 2008/0213479 A1 | 9/2008 | Chou et al. |
| 2008/0242116 A1 | 10/2008 | Clark |
| 2008/0274302 A1 | 11/2008 | Hasebe et al. |
| 2008/0311760 A1 | 12/2008 | Nodera et al. |
| 2008/0317972 A1 | 12/2008 | Hendriks et al. |
| 2009/0018668 A1 | 1/2009 | Galbraith |
| 2009/0039349 A1 | 2/2009 | Honda |
| 2009/0041952 A1 | 2/2009 | Yoon et al. |
| 2009/0065896 A1 | 3/2009 | Hwang et al. |
| 2009/0075490 A1 | 3/2009 | Dussarrat |
| 2009/0148625 A1 | 6/2009 | Yeom et al. |
| 2009/0155606 A1 | 6/2009 | Yoon et al. |
| 2009/0163012 A1 | 6/2009 | Clark et al. |
| 2009/0191722 A1 | 7/2009 | Hasebe et al. |
| 2009/0203197 A1 | 8/2009 | Hanawa et al. |
| 2009/0208880 A1 | 8/2009 | Nemani et al. |
| 2009/0278224 A1 | 11/2009 | Kim et al. |
| 2010/0022099 A1 | 1/2010 | Van Nooten et al. |
| 2010/0025824 A1 | 2/2010 | Chen et al. |
| 2010/0051578 A1 | 3/2010 | Chang et al. |
| 2010/0096688 A1 | 4/2010 | Balseanu et al. |
| 2010/0099236 A1* | 4/2010 | Kwon et al. .................. 438/435 |
| 2010/0099271 A1 | 4/2010 | Hausmann et al. |
| 2010/0102417 A1 | 4/2010 | Ganguli et al. |
| 2010/0124618 A1 | 5/2010 | Kobayashi et al. |
| 2010/0124621 A1 | 5/2010 | Kobayashi et al. |
| 2010/0136260 A1 | 6/2010 | Matsunaga et al. |
| 2010/0136313 A1 | 6/2010 | Shimizu et al. |
| 2010/0167555 A1 | 7/2010 | Maula et al. |
| 2010/0221925 A1 | 9/2010 | Lee et al. |
| 2010/0255218 A1 | 10/2010 | Oka et al. |
| 2010/0304574 A1 | 12/2010 | Nodera et al. |
| 2010/0310791 A1 | 12/2010 | Shimazu et al. |
| 2011/0003445 A1 | 1/2011 | Murata et al. |
| 2011/0014795 A1 | 1/2011 | Lee et al. |
| 2011/0014796 A1 | 1/2011 | Hayashi |
| 2011/0014798 A1 | 1/2011 | Mallick et al. |
| 2011/0042744 A1 | 2/2011 | Cheng et al. |
| 2011/0064969 A1 | 3/2011 | Chen et al. |
| 2011/0086516 A1 | 4/2011 | Lee et al. |
| 2011/0124187 A1 | 5/2011 | Afzali-Ardakani et al. |
| 2011/0139176 A1 | 6/2011 | Cheung et al. |
| 2011/0143548 A1 | 6/2011 | Cheung et al. |
| 2011/0151142 A1 | 6/2011 | Seamons et al. |
| 2011/0151246 A1 | 6/2011 | Ramon Moreno et al. |
| 2011/0151674 A1 | 6/2011 | Tang et al. |
| 2011/0151678 A1* | 6/2011 | Ashtiani et al. .............. 438/786 |
| 2011/0159672 A1 | 6/2011 | Matsushita et al. |
| 2011/0198756 A1 | 8/2011 | Thenappan et al. |
| 2011/0201210 A1 | 8/2011 | Sato et al. |
| 2011/0215445 A1 | 9/2011 | Yang et al. |
| 2011/0256726 A1* | 10/2011 | LaVoie et al. ................ 438/702 |
| 2011/0256734 A1 | 10/2011 | Hausmann et al. |
| 2011/0298099 A1 | 12/2011 | Lee et al. |
| 2011/0309475 A1* | 12/2011 | Lee .............................. 257/532 |
| 2012/0009802 A1 | 1/2012 | LaVoie et al. |
| 2012/0009803 A1 | 1/2012 | Jung et al. |
| 2012/0021252 A1 | 1/2012 | Lee |
| 2012/0028454 A1 | 2/2012 | Swaminathan et al. |
| 2012/0028469 A1 | 2/2012 | Onizawa et al. |
| 2012/0058282 A1 | 3/2012 | Hong et al. |
| 2012/0077349 A1* | 3/2012 | Li et al. ....................... 438/762 |
| 2012/0108079 A1 | 5/2012 | Mahajani |
| 2012/0113672 A1 | 5/2012 | Dubrow et al. |
| 2012/0164846 A1 | 6/2012 | Ha et al. |
| 2012/0193693 A1 | 8/2012 | Kanaya |
| 2012/0213940 A1 | 8/2012 | Mallick |
| 2012/0280200 A1 | 11/2012 | Tada et al. |
| 2012/0282418 A1 | 11/2012 | Chou et al. |
| 2012/0315394 A1 | 12/2012 | Ito |
| 2013/0040447 A1 | 2/2013 | Swaminathan et al. |
| 2013/0058161 A1 | 3/2013 | Yamanaka et al. |
| 2013/0058162 A1 | 3/2013 | Yamanaka et al. |
| 2013/0071580 A1 | 3/2013 | Weidman et al. |
| 2013/0115783 A1 | 5/2013 | Kim et al. |
| 2013/0189854 A1 | 7/2013 | Hausmann et al. |
| 2013/0196516 A1 | 8/2013 | Lavoie et al. |
| 2013/0252437 A1 | 9/2013 | Sano et al. |
| 2013/0309415 A1 | 11/2013 | Swaminathan et al. |
| 2013/0319329 A1 | 12/2013 | Li et al. |
| 2013/0344248 A1 | 12/2013 | Clark |
| 2014/0030444 A1 | 1/2014 | Swaminathan et al. |
| 2014/0051262 A9 | 2/2014 | Lavoie et al. |
| 2014/0106574 A1 | 4/2014 | Kang et al. |
| 2014/0113457 A1 | 4/2014 | Sims et al. |
| 2014/0120270 A1 | 5/2014 | Tour et al. |
| 2014/0120737 A1 | 5/2014 | Swaminathan et al. |
| 2014/0134827 A1 | 5/2014 | Swaminathan et al. |
| 2014/0141542 A1 | 5/2014 | Kang et al. |
| 2014/0141626 A1 | 5/2014 | Hausmann et al. |
| 2014/0182619 A1 | 7/2014 | Goto et al. |
| 2014/0209562 A1 | 7/2014 | LaVoie et al. |
| 2014/0216337 A1 | 8/2014 | Swaminathan et al. |

(56) References Cited

U.S. PATENT DOCUMENTS

| | | |
|---|---|---|
| 2014/0264555 A1 | 9/2014 | Ahn et al. |
| 2014/0273428 A1 | 9/2014 | Shero et al. |
| 2014/0295084 A1 | 10/2014 | Shirai et al. |
| 2014/0302686 A1 | 10/2014 | Pan et al. |
| 2015/0109814 A1 | 4/2015 | Chen et al. |
| 2015/0126042 A1 | 5/2015 | Pasquale et al. |
| 2015/0147483 A1 | 5/2015 | Fukazawa |
| 2015/0159271 A1 | 6/2015 | Lee et al. |
| 2015/0170900 A1 | 6/2015 | LaVoie |
| 2015/0206719 A1 | 7/2015 | Swaminathan et al. |
| 2015/0235835 A1 | 8/2015 | Swaminathan et al. |
| 2015/0243883 A1 | 8/2015 | Swaminathan et al. |
| 2015/0249013 A1 | 9/2015 | Arghavani et al. |
| 2016/0064211 A1 | 3/2016 | Swaminathan et al. |
| 2016/0118246 A1 | 4/2016 | Kang et al. |
| 2016/0148800 A1 | 5/2016 | Henri et al. |
| 2016/0155676 A1 | 6/2016 | Kang et al. |
| 2016/0163972 A1 | 6/2016 | Swaminathan et al. |
| 2016/0293398 A1 | 10/2016 | Danek et al. |
| 2016/0293838 A1 | 10/2016 | Swaminathan et al. |
| 2016/0336178 A1 | 11/2016 | Swaminathan et al. |

FOREIGN PATENT DOCUMENTS

| | | |
|---|---|---|
| CN | 101255548 A | 9/2008 |
| CN | 101378007 A | 3/2009 |
| CN | 101416293 A | 4/2009 |
| CN | 101535524 A | 9/2009 |
| CN | 101889331 A | 11/2010 |
| CN | 102906304 A | 1/2013 |
| CN | 103137864 A | 6/2013 |
| EP | 0 277 766 | 8/1988 |
| EP | 0 541 212 | 5/1993 |
| EP | 1 703 552 A2 | 9/2006 |
| EP | 2 278 046 | 1/2011 |
| JP | S48-043472 A | 6/1973 |
| JP | H02-093071 A | 4/1990 |
| JP | H06-177120 A | 6/1994 |
| JP | 2001-338922 A | 12/2001 |
| JP | 2002-134497 A | 5/2002 |
| JP | 2002-164345 A | 6/2002 |
| JP | 2007-180362 A | 7/2007 |
| JP | 2007-287889 A | 11/2007 |
| JP | 2007-287890 A | 11/2007 |
| JP | 2008-500742 A | 1/2008 |
| JP | 2008-109093 A | 5/2008 |
| JP | 4364320 | 8/2009 |
| JP | 2009-540128 A | 11/2009 |
| JP | 2010-10497 | 1/2010 |
| JP | 2010-245518 A | 10/2010 |
| JP | 2011-023576 A | 2/2011 |
| JP | 2013166965 A | 8/2013 |
| JP | 2013225655 A | 10/2013 |
| KR | 10-2001-0111448 | 12/2001 |
| KR | 10-0356473 B1 | 10/2002 |
| KR | 10-2004-0001036 | 1/2004 |
| KR | 10-0734748 B | 7/2007 |
| KR | 10-2009-0057665 | 6/2009 |
| KR | 10-2009-0080019 | 7/2009 |
| KR | 10-2009-0081396 | 7/2009 |
| KR | 10-20130056608 A | 5/2013 |
| TW | 201009942 A | 3/2010 |
| TW | 201042706 A1 | 12/2010 |
| WO | WO 2004/032196 | 4/2004 |
| WO | WO 2006/026350 | 3/2006 |
| WO | WO 2006/104741 | 10/2006 |
| WO | WO 2007/043709 | 4/2007 |
| WO | WO 2007/118026 | 10/2007 |
| WO | WO 2011/130326 | 10/2011 |
| WO | WO 2011/130397 | 10/2011 |
| WO | WO 2012/040317 | 3/2012 |
| WO | WO 2012/048094 | 4/2012 |
| WO | WO 2012/087737 | 6/2012 |
| WO | WO 2013/032786 | 3/2013 |
| WO | WO 2013/043330 | 3/2013 |
| WO | WO 2013/065806 | 5/2013 |
| WO | WO 2013/112727 | 8/2013 |

OTHER PUBLICATIONS

US Notice of Allowance dated Aug. 7, 2014 issued U.S. Appl. No. 14/133,239.
US Examiner's Answer to Appeal Brief (filed May 22, 2014) Before the Patent Trial and Appeal Board dated Aug. 14, 2014 issued U.S. Appl. No. 13/224,240.
US Notice of Allowance dated Oct. 8, 2014 issued in U.S. Appl. No. 13/607,386.
Korean Final Office Action dated Aug. 18, 2014 issued in KR 10-2012-0043797.
PCT International Preliminary Report on Patentability and Written Opinion dated Aug. 7, 2014, issued in Application No. PCT/US2013/022977.
U.S. Appl. No. 14/231,554, filed Mar. 31, 2014, entitled "Plasma Activated Conformal Film Deposition".
U.S. Appl. No. 14/133,239, filed Dec. 18, 2013, entitled "Plasma Activated Conformal Dielectric Film Deposition".
U.S. Appl. No. 14/074,617, filed Nov. 7, 2013, entitled "Methods for Depositing Films on Sensitive Substrates".
U.S. Appl. No. 14/183,287, filed Feb. 18, 2014, entitled "High Growth Rate Process for Conformal Aluminum Nitride."
U.S. Appl. No. 14/187,145, filed Feb. 21, 2014, entitled "Plasma Assisted Atomic Layer Deposition Titanium Oxide for Conformal Encapsulation and Gap Fill Applications."
U.S. Appl. No. 14/195,653, filed Mar. 3, 2014, entitled "RF Cycle Purging to Reduce Surface Roughness in Metal Oxide and Metal Nitride Films."
U.S. Appl. No. 14/194,324, filed Feb. 28, 2014, entitled "Soft Landing Nanolaminates for Advanced Patterning."
US Office Action dated Mar. 15, 2013 issued in U.S. Appl. No. 13/084,399.
US Final Office Action dated Sep. 13, 2013 issued in U.S. Appl. No. 13/084,399.
US Notice of Allowance dated Jan. 15, 2014 issued in U.S. Appl. No. 13/084,399.
US Office Action dated Sep. 14, 2012 issued in U.S. Appl. No. 13/084,305.
US Final Office Action dated Apr. 25, 2013 issued in U.S. Appl. No. 13/084,305.
US Office Action dated Apr. 13, 2011 issued in U.S. Appl. No. 12/889,132.
US Notice of Allowance dated Sep. 30, 2011 issued in U.S. Appl. No. 12/889,132.
US Office Action dated Aug. 1, 2012 issued in U.S. Appl. No. 13/011,569.
US Final Office Action dated Feb. 26, 2013 issued in U.S. Appl. No. 13/011,569.
US Notice of Allowance dated May 6, 2013 issued in U.S. Appl. No. 13/011,569.
US Office Action dated Apr. 4, 2013 issued U.S. Appl. No. 13/242,084.
US Notice of Allowance dated Jun. 19, 2013 issued U.S. Appl. No. 13/242,084.
US Notice of Allowance dated Sep. 19, 2013 issued U.S. Appl. No. 13/242,084.
US Office Action dated Apr. 29, 2013 issued U.S. Appl. No. 13/224,240.
US Final Office Action dated Nov. 22, 2013 issued U.S. Appl. No. 13/224,240.
US Office Action dated Jun. 7, 2013 issued U.S. Appl. No. 13/414,619.
US Notice of Allowance dated Jul. 26, 2013, issued U.S. Appl. No. 13/414,619.
US Office Action dated Apr. 11, 2014 issued in U.S. Appl. No. 14/065,334.
US Office Action dated May 24, 2013 issued U.S. Appl. No. 13/472,282.

(56) References Cited

OTHER PUBLICATIONS

US Notice of Allowance dated Oct. 4, 2013 issued U.S. Appl. No. 13/472,282.
US Office Action dated May 21, 2014 issued in U.S. Appl. No. 13/607,386.
US Office Action dated Jun. 13, 2014 issued in U.S. Appl. No. 13/953,616.
US Office Action dated Jul. 10, 2014 issued in U.S. Appl. No. 14/144,107.
PCT International Search Report and Written Opinion, dated Oct. 20, 2011, issued in PCT/US2011/032186.
PCT International Preliminary Report on Patentability, dated Oct. 26, 2012, issued in PCT/US2011/032186.
PCT Invitation to Pay Additional Fees; Communication Re Partial International Search, dated Dec. 16, 2011, issued in PCT/US2011/032303.
PCT International Search Report and Written Opinion, dated Feb. 20, 2012, issued in PCT/US2011/032303.
PCT International Preliminary Report on Patentability and Written Opinion, dated Oct. 26, 2012, issued in PCT/US2011/032303.
PCT International Search Report and Written Opinion dated May 2, 2012 issued in Application No. PCT/US2011/052537.
PCT International Preliminary Report on Patentability and Written Opinion dated Apr. 4, 2013 issued in Application No. PCT/US2011/052537.
PCT International Search Report and Written Opinion dated Dec. 18, 2012, issued in Application No. PCT/US2012/052769.
PCT International Preliminary Report on Patentability and Written Opinion dated Apr. 3, 2014, issued in Application No. PCT/US2012/052769.
PCT International Search Report and Written Opinion dated Feb. 28, 2013, issued in Application No. PCT/US2012/051740.
PCT International Preliminary Report on Patentability and Written Opinion dated Mar. 13, 2014, issued in Application No. PCT/US2012/051740.
European Extended Search Report dated Apr. 14, 2014 issued in EP 13 15 2046.
Korean Notice of Provisional Rejection dated Dec. 6, 2013 issued in KR 10-2012-0043797.
PCT International Search Report and Written Opinion dated May 27, 2013, issued in Application No. PCT/US2013/022977.
Cecchi et al., (2007) "Ultra-thin conformal pore-sealing of low-k materials by plasma-assisted ALD," *University of New Mexico. Albuquerque, NM. Sandia National Labs*, Albuquerque, NM, 1 page.
Choi, Gyu-Jin et al., (2009) "Plasma-enhanced atomic layer deposition of $TiO_2$ and Al-doped $TiO_2$ films using $N_2O$ and $O_2$ reactants," *Journal of the Electrochemical Society*, 156(9):G138-G143.
Hausmann et al. (2002) "Atomic Layer Deposition of Hafnium and Zirconium Oxides Using Metal Amide Precursors," *Chem. Mater.* 14(10):4350-4358.
Kim, H., et al. (2002) "The Growth of Tantalum Thin Films by Plasma-Enhanced Atomic Layer Deposition and Diffusion Barrier Properties," *Mat. Res. Soc. Symp. Proc.* 716:B8.5.1-B8.5.6.
King, Sean W., (Jul./Aug. 2011) "Plasma enhanced atomic layer deposition of $SiN_x$:H and $SiO_2$," *J. Vac. Sci. Technol.* A29(4):9 pages.
Ko, Myoung-Gyun, et al., "Characterization of ruthenium thin film deposited by rf-direct plasma atomic layer deposition," *209th ECS Meeting*, Abstract #50, p. 1 [Downloaded on Jun. 9, 2014].
Ko, Myoung-Gyun, et al., (Oct. 2008) "Correlation of Carbon Content with the Thermal Stability of Ruthenium Deposited by Using RF-Direct Plasma-Enhanced Atomic-Layer Deposition," *Journal of the Korean Physical Society*, 53(4):2123-2128.
Lee et al., (2005) "Chemically conformal deposition of $SrTiO_3$ thin films by Atomic Layer Deposition using conventional metal organic precursors and remote-plasma activated $H_2O$," School of Materials Science and Engineering, and Inter-university Semiconductor Research Center, Seoul National University, *Microelectronic Engineering* 80:158-161.
Lee, Jong Ju, (2005) "Low-impurity, highly conformal atomic layer deposition of titanium nitride using $NH_3$-Ar-$H_2$ plasma treatment for capacitor electrodes," *Materials Letters*, 59:615-617.
Li, Xingcun, et al., (2011) "Atomic Layer Deposition $Al_2O_3$ Thin Films in Magnetized Radio Frequency Plasma Source," *Physics Procedia* 18:100-106.
Man P.F. et al., (Feb. 11-15, 1996) "Elimination of Post-Release Adhesion in Microstructures Using Conformal Fluorocarbon Coatings," *MEMS '96 Proceedings*, IEEE, pp. 55-60.
Nguyen, S.V. et al., (Jan./Mar. 1999) "Plasma-assist chemical vapor deposition of dielectric thin films for ULSI semiconductor circuits," *IBM J.Res.Develop.* 43(1.2):5-38.
Plasma Enhanced Atomic Layer Deposition (PEALD), Website: http ://www.asm.com/index.php?option=com_content&task=view &id=19&Itemid=161 (2010), 1 page.
"PlasmaPro™ NGP®80 Range," *Oxford Instruments* (2010), 8 pages.
Van der Straten et al. (2004) "Atomic layer deposition of tantalum nitride for ultrathin liner applications in advanced copper metallization schemes," *Journal of Materials Research*, 19(2):447-453.
U.S. Appl. No. 14/607,997, filed Jan. 28, 2015, entitled "Plasma Activated Conformal Dielectric Film Deposition".
U.S. Appl. No. 14/678,736, filed Apr. 3, 2015, entitled "Deposition of Conformal Films by Atomic Layer Deposition and Atomic Layer Etch."
US Final Office Action dated Jun. 10, 2015 issued in U.S. Appl. No. 14/231,554.
US Office Action dated Mar. 2, 2015 issued in U.S. Appl. No. 14/137,860.
US Notice of Allowance dated Mar. 19, 2015 issued in U.S. Appl. No. 14/144,107.
US Office Action dated Jul. 2, 2015 issued in U.S. Appl. No. 14/187,145.
Chinese First Office Action [no translation] dated Jun. 2, 2015 issued in CN 201180045808.6.
Korean Trial Decision (English description) dated May 25, 2015 issued in KR 10-2012-0043797.
U.S. Appl. No. 14/552,011, filed Nov. 24, 2014, entitled "Selective Inhibition in Atomic Layer Deposition of Silicon-Containing Films."
US Office Action dated Jan. 2, 2015 issued in U.S. Appl. No. 14/231,554.
US Notice of Allowance dated Nov. 26, 2014 issued U.S. Appl. No. 14/133,239.
US Notice of Allowance dated Nov. 19, 2014 issued in U.S. Appl. No. 13/607,386.
US Final Office Action dated Nov. 24, 2014 issued in U.S. Appl. No. 13/953,616.
US Office Action dated Dec. 11, 2014 issued in U.S. Appl. No. 14/074,596.
US Final Office Action dated Jan. 15, 2015 issued in U.S. Appl. No. 14/144,107.
Puurunen, Riikka L. (2005) "Surface chemistry of atomic layer deposition: A case study for the trimethylaluminum/water process," Journal of Applied Physics, 97:121301-1-121301-52.
U.S. Appl. No. 15/201,221, filed Jul. 1, 2016, entitled "Selective Atomic Layer Deposition With Post-Dose Treatment."
U.S. Appl. No. 15/253,301, filed Aug. 31, 2016, entitled "Selective Atomic Layer Deposition For Gapfill Using Sacrificial Underlayer."
U.S. Appl. No. 15/199,608, filed Jun. 30, 2016, entitled "Apparatus and Method for Deposition and Etch In Gap Fill."
US Notice of Allowance dated Aug. 31, 2015 issued in U.S. Appl. No. 14/231,554.
US Office Action dated Jul. 1, 2016 issued in U.S. Appl. No. 13/963,212.
US Office Action dated Sep. 21, 2015 issued U.S. Appl. No. 14/607,997.
US Final Office Action dated Mar. 18, 2016 issued U.S. Appl. No. 14/607,997.
US Notice of Allowance dated Jun. 16, 2016 issued U.S. Appl. No. 14/607,997.
US Notice of Allowance dated Sep. 27, 2016 issued U.S. Appl. No. 14/607,997.

(56) References Cited

OTHER PUBLICATIONS

US Patent Board Decision on Appeal Before the Patent Trial and Appeal Board (Examiner Affirmed) dated Aug. 11, 2016 issued U.S. Appl. No. 13/224,240.
US Notice of Allowance dated Nov. 17, 2016 issued U.S. Appl. No. 13/224,240.
US Office Action dated Dec. 24, 2015 issued in U.S. Appl. No. 14/074,596.
US Notice of Allowance dated Feb. 12, 2016 issued in U.S. Appl. No. 14/074,596.
US Office Action dated May 15, 2015 issued in U.S. Appl. No. 14/074,617.
US Notice of Allowance dated Nov. 20, 2015 issued in U.S. Appl. No. 14/074,617.
US Office Action dated Aug. 14, 2015 issued in U.S. Appl. No. 14/061,587.
US Notice of Allowance dated Feb. 11, 2016 issued in U.S. Appl. No. 14/061,587.
US Notice of Allowance [Supplemental Notice of Allowability] dated Mar. 1, 2016 issued in U.S. Appl. No. 14/061,587.
US Notice of Allowance dated Oct. 1, 2015 issued in U.S. Appl. No. 14/137,860.
US Notice of Allowance [Supplemental Notice of Allowability] dated Oct. 22, 2015 issued in U.S. Appl. No. 14/137,860.
US Office Action dated Oct. 21, 2015 issued in U.S. Appl. No. 14/194,549.
US Final Office Action dated Nov. 1, 2016 issued in U.S. Appl. No. 14/194,549.
US Notice of Allowance dated Aug. 5, 2015 issued in U.S. Appl. No. 14/183,287.
US Office Action dated Aug. 1, 2016 issued in U.S. Appl. No. 14/932,869.
US Final Office Action dated Dec. 16, 2015 issued in U.S. Appl. No. 14/187,145.
US Notice of Allowance dated Feb. 25, 2016 issued in U.S. Appl. No. 14/187,145.
US Office Action dated Jun. 14, 2016 issued in U.S. Appl. No. 15/019,904.
US Notice of Allowance dated Oct. 13, 2016 issued in U.S. Appl. No. 15/019,904.
US Office Action dated Nov. 25, 2016 issued in U.S. Appl. No. 15/178,474.
US Office Action dated May 25, 2016 issued in U.S. Appl. No. 14/552,011.
US Notice of Allowance dated Sep. 26, 2016 issued in U.S. Appl. No. 14/552,011.
US Notice of Allowance dated Jul. 15, 2016 issued in U.S. Appl. No. 14/678,736.
Taiwan Office Action dated Apr. 27, 2016 issued in Application No. TW 100113041.
Chinese Second Office Action dated Feb. 2, 2016 issued in Application No. CN 201180045808.6.
Taiwan Office Action dated May 5, 2016 issued in TW 100134208.
Chinese First Office Action dated Nov. 19, 2015 issued in Application No. CN 201280046487.6.
Chinese Second Office Action dated Aug. 22, 2016 issued in Application No. CN 201280046487.6.
Japanese Office Action dated Aug. 23, 2016 issued in Application No. JP 2014-531838.
Singapore Supplementary Examination Report dated Jun. 1, 2016 issued in SG 11201400633R.
Taiwan Notice of Allowance and Search Report dated Dec. 18, 2015 issued in Application No. TW 101134692.
Chinese First Office Action dated Nov. 6, 2015 issued in Application No. CN 201280053888.4.
Chinese Second Office Action dated Aug. 16, 2016 issued in Application No. CN 201280053888.4.
Taiwan Office Action and Search Report dated Jan. 27, 2016 issued in Application No. TW 101131556.
Taiwan Office Action and Search Report dated Nov. 9, 2016 issued in Application No. TW 101131556.
Chinese First Office Action dated May 19, 2016 issued in CN 201310021460.8.
Chinese First Office Action dated Feb. 22, 2016 issued in Application No. CN 201380006994.1.
Singapore Supplementary Examination Report dated Aug. 11, 2016 issued in SG 11201404315R.
Taiwan Office Action and Search Report dated Jul. 20, 2016 issued in Application No. TW 102102879.
Taiwan Office Action dated Oct. 25, 2016 issued in Application No. TW 102117772.
Chinese First Office Action dated Nov. 28, 2016 issued in Application No. CN 201410521390.7.
Chinese First Office Action dated Apr. 11, 2016 issued in Application No. CN 201510086588.1.
Japanese Office Action dated Apr. 19, 2016 issued in Application No. JP 2015-21804.
Korean First Office Action dated Feb. 19, 2016, issued in Application No. KR 10-2015-0022610.
Korean Final Office Action dated Jun. 29, 2016, issued in Application No. KR 10-2015-0022610.
Lavareda et al., (2004) "Properties of a-Si:H TFTs using silicon carbonitride as dielectric," Journal of Non-Crystalline Solids, 338-340:797-801.
US Office Action dated Jan. 12, 2017 issued in U.S. Appl. No. 13/963,212.
US Notice of Allowance (Supplemental Notice of Allowability) dated Feb. 21, 2017 issued U.S. Appl. No. 13/224,240.
US Office Action dated Feb. 3, 2017 issued in U.S. Appl. No. 14/987,542.
US Notice of Allowance dated Feb. 10, 2017 issued in U.S. Appl. No. 15/178,474.

\* cited by examiner

METHODS FOR DEPOSITING SILICON OXIDE

BACKGROUND

The fabrication of integrated circuits includes many diverse processing steps. One of the operations frequently employed is the deposition of a dielectric film. The film may be deposited on a relatively flat substrate, or it may be deposited into a gap between features patterned over or into silicon substrates. One method of depositing such a film is through plasma enhanced atomic layer deposition (PEALD). In this type of method, several operations are undertaken in a cyclic manner to deposit a conformal film. Typically, PEALD processes include the steps of (a) providing a dose of a first reactant to a reaction chamber, (b) purging the reaction chamber, (c) flowing a second reactant to the reaction chamber, (d) igniting a plasma in the reaction chamber, and (e) extinguishing the plasma and purging the reaction chamber. As a result of the nature of precursor delivery/adsorption onto the substrate surface, a single cycle of a PEALD process deposits a monolayer of material. The operations may be repeated a number of times to deposit additional monolayers to reach a desired film thickness.

SUMMARY

Various embodiments herein relate to methods and apparatus for forming silicon oxide films on semiconductor substrates. Certain embodiments employ a relatively high deposition temperature, a relatively high level of RF power, and a relatively long plasma exposure duration, as compared to conventional methods. In some cases, additional plasma treatments may be performed periodically during deposition. Further, a bilayer may be formed in some cases, the bottom layer being deposited at different conditions than the upper layer.

In one aspect of the disclosed embodiments, a method of depositing a silicon oxide film on a surface of a substrate in a single or multi-station reaction chamber is provided. The method may include (a) flowing a silicon-containing reactant in vapor phase into the reaction chamber under conditions allowing the silicon-containing reactant to adsorb onto the surface of the substrate; (b) after (a), flowing an oxygen-containing reactant in vapor phase into the reaction chamber, and exposing the surface of the substrate to plasma to drive a surface reaction between the silicon-containing reactant and the oxygen-containing reactant to form the silicon oxide film, where flowing the oxygen-containing reactant and exposing the surface of the substrate to plasma occur at least partially at the same time, where a temperature of the substrate is maintained between about 435-550° C. during (a) and (b), where the plasma is generated using a total RF power between about 2.1-3.6 Watts per square centimeter of substrate area, and where the surface of the substrate is exposed to the plasma in (b) for a duration between about 2-5 seconds; and (c) repeating (a) and (b) until the silicon oxide film reaches a target thickness.

In certain cases, the silicon oxide film forms in a recessed feature having an aspect ratio of about 10 or higher. The width of the recessed feature may be between about 2-100 µm, for example between about 5-50 µm, or between about 5-20 µm. The recessed feature may be a through-silicon-via in some cases. The recessed feature may also form a portion of a 3D-NAND structure.

Purge steps may be introduced at appropriate times. For instance, the method may include performing a post-reactant purge after the flow of the silicon-containing reactant has ceased and before the flow of the oxygen-containing reactant begins, and performing a post-plasma purge after exposing the surface of the substrate to plasma. The silicon-containing reactant may be flowed into the reaction chamber for a duration between about 0.2-1 second in (a). The post-reactant purge may have a duration between about 0.2-1 second. The oxygen-containing reactant may be flowed into the reaction chamber and the surface of the substrate may be exposed to plasma for a duration between about 0.1-0.5 seconds. In some cases, the silicon-containing reactant includes an amino substituted silane, and the oxygen-containing reactant includes at least one of oxygen, nitrous oxide, ozone, carbon monoxide, nitric oxide, nitrogen dioxide, sulfur oxide, sulfur dioxide, an oxygen-containing hydrocarbon, water, and mixtures thereof. In some cases the amino substituted silane may include BTBAS. Many other reactants may also be used. The pressure within the reaction chamber may be maintained between about 2-6 Torr during (a) and (b) in certain cases.

The film formed according to the disclosed embodiments is often a high quality film, as evidenced by relatively low wet etch rates. In some embodiments, the silicon oxide film exhibits a first wet etch rate at a field region proximate a top opening of the feature, a second wet etch rate at a top corner of the feature, a third wet etch rate at a middle of a sidewall of the feature, and a fourth wet etch rate at a bottom of the feature, where the first wet etch rate is equal to or greater than the third wet etch rate. The first wet etch rate may be equal to or greater than the second wet etch rate, which may be equal to or greater than the third wet etch rate, which may be equal to or greater than the fourth wet etch rate. In some cases, the first wet etch rate, second wet etch rate, third wet etch rate, and fourth wet etch rate do not differ from one another by more than about 15%.

The film formed according to the disclosed embodiments may also exhibit good electrical qualities. For instance, the silicon oxide film may have a breakdown voltage between about −7.6 and −12.7 MC/cm. The silicon oxide film may exhibit a flatband voltage that does not differ by more than about 1.3 V across the substrate.

As mentioned, the method may also include performing periodic plasma treatments. The plasma treatment may include generating a treatment plasma from a treatment plasma generation gas, and exposing the surface of the substrate to the treatment plasma generation gas for a duration between about 10-100 seconds. The treatment plasma may have the effect of densifying the film. In some cases the treatment plasma generation gas is oxygen, a mixture of oxygen and argon, or helium. Where a mixture of oxygen and argon are used, a ratio of oxygen:argon in the plasma treatment generation gas may be between about 0.5:1 and 2:1, as measured in SLM. The plasma generation gas may flow at a rate between about 5-20 SLM. A pressure within the reaction chamber may be maintained between about 2-6 Torr while the surface of the substrate is exposed to the treatment plasma. In some cases the treatment plasma may be generated using a total RF power between about 0.3-1.8 Watts per square centimeter of substrate area.

The embodiments herein also relate to cases where a bilayer is formed. For instance, the method may further include (d) after (c), flowing a second silicon-containing reactant in vapor phase into the reaction chamber under conditions allowing the second silicon-containing reactant to adsorb onto the surface of the substrate; (e) after (d), flowing a second oxygen-containing reactant in vapor phase into the reaction chamber, and exposing the surface of the substrate to a second plasma to drive a surface reaction between the second silicon-containing reactant and the second oxygen-containing reactant to form a secondary silicon oxide film, where flowing the second oxygen-containing reactant and exposing the surface of the substrate to the second plasma occur at least partially at the same time, where a temperature of the substrate is maintained below about 400° C. during (d) and (e), where the second plasma is generated using a total RF power between about 0.7-1.8 Watts per square centimeter of substrate area, the RF power being provided only at high frequency RF, where the surface of the substrate is exposed to the second plasma in (e) for a duration between about 0.5-1 second; and (f) repeating (d) and (e) until the secondary silicon oxide film reaches a second target thickness.

In another aspect of the disclosed embodiments, a method of forming a silicon oxide bilayer on a semiconductor substrate is provided, the method including: (a) forming a first layer of silicon oxide on the substrate at a first temperature through a first atomic layer deposition reaction involving a first plasma generated at a first RF power and periodically exposed to the substrate for a first duration, and (b) forming a second layer of silicon oxide on the first layer of silicon oxide at a second temperature through a second atomic layer deposition reaction, the first layer of silicon oxide and second layer of silicon oxide together forming the silicon oxide bilayer, where formation of the second layer of silicon oxide involves a second plasma generated at a second RF power and periodically exposed to the substrate for a second duration, where the first temperature is higher than the second temperature, where the first RF power is greater than the second RF power, where the first duration is greater than the second duration, and where the first layer of silicon oxide has a lower wet etch rate than the second layer of silicon oxide.

A thickness of the first bilayer of silicon oxide may represent about 20% or less of a total thickness of the silicon oxide bilayer. In certain embodiments the first RF power is between about 2.1-3.6 Watts per square centimeter of substrate area, and the first duration is between about 2-5 seconds. In these or other cases, the second RF power may be between about 0.7-1.8 Watts per square centimeter of substrate area, and the second duration may be between about 0.5-1 second. The first temperature may be between about 435-550° C. The second temperature may be about 400° C. or less.

In a further aspect of the disclosed embodiments, an apparatus for depositing silicon oxide film on a surface of a substrate is provided, the apparatus including: a reaction chamber; a plasma source for providing plasma in the reaction chamber; one or more inlets for providing a silicon-containing reactant and an oxygen-containing reactant to the reaction chamber; a substrate support for supporting the substrate within the reaction chamber; and a controller having instructions to: (a) flow the silicon-containing reactant in vapor phase into the reaction chamber under conditions allowing the silicon-containing reactant to adsorb onto the surface of the substrate; (b) after (a), flow the oxygen-containing reactant in vapor phase into the reaction chamber, and expose the surface of the substrate to plasma to drive a surface reaction between the silicon-containing reactant and the oxygen-containing reactant to form the silicon oxide film, where the controller has instructions to flow the oxygen-containing reactant and expose the surface of the substrate to plasma at least partially at the same time, where the controller has instructions to maintain a temperature of the substrate between about 435-550° C. during (a) and (b), where the controller has instructions to generate plasma using a total RF power between about 2.1-3.6 Watts per square centimeter of substrate area, and to generate the plasma using only high frequency RF, and where the controller has instructions to expose the surface of the substrate to the plasma in (b) for a duration between about 2-5 seconds; and (c) repeat (a) and (b) until the silicon oxide film reaches a target thickness.

In various embodiments, the controller may further have instructions to purge the reaction chamber after the flow of silicon-containing reactant has ceased and before the flow of oxygen-containing reactant begins, and to purge the reaction chamber after exposing the surface of the substrate to plasma. The controller may have instructions to flow the silicon-containing reactant into the reaction chamber for a duration between about 0.2-1 second in (a), purge the reaction chamber for a duration between about 0.2-1 second between (a) and (b), flow the oxygen-containing reactant into the reaction chamber and expose the surface of the substrate to plasma for a duration between about 0.5-1 second in (b), and to purge the reaction chamber for a duration between about 0.1-0.5 seconds after (b). The controller may also have instructions to maintain a pressure within the reaction chamber between about 2-6 Torr during (a) and (b).

The controller may further have instructions to expose the surface of the substrate to a plasma treatment by: generating a treatment plasma from a treatment plasma generation gas; and exposing the surface of the substrate to the treatment plasma for a duration between about 10-100 seconds to thereby densify the silicon oxide film. In some cases the controller may have instructions to generate the treatment plasma using a total RF power between about 0.3-1.8 Watts per square centimeter of substrate area.

In certain cases, the controller may have instructions to form a bilayer. For instance, the controller may further have instructions to: (d) after (c) flow a second silicon-containing reactant in vapor phase into the reaction chamber under conditions allowing the second silicon-containing reactant to adsorb onto the surface of the substrate; (e) after (d), flow a second oxygen-containing reactant in vapor phase into the reaction chamber, and expose the surface of the substrate to a second plasma to drive a surface reaction between the second silicon-containing reactant and the second oxygen-containing reactant to form a secondary silicon oxide film, where the controller has instructions to flow the second oxygen-containing reactant and expose the surface of the substrate to the second plasma at least partially at the same time, where the controller has instructions to maintain a temperature of the substrate below about 400° C. during (d) and (e), where the controller has instructions to generate the second plasma using a total RF power between about 0.7-1.8 Watts per square centimeter of substrate area, and using only high frequency RF, and where the controller has instructions to expose the surface of the substrate to the second plasma in (e) for a duration between about 0.5-1 second; and (f) repeat (d) and (e) until the secondary silicon oxide film reaches a second target thickness.

In yet a further aspect of the disclosed embodiments, An apparatus for forming a silicon oxide bilayer on a semiconductor substrate is provided, the apparatus including: a reaction chamber; a plasma source for providing plasma in the reaction chamber; one or more inlets for providing a silicon-containing reactant and an oxygen-containing reactant to the reaction chamber; a substrate support for supporting the substrate within the reaction chamber; and a controller having instructions to: (a) form a first layer of silicon oxide on the substrate at a first temperature through a first atomic layer deposition reaction involving a first plasma generated at a first RF power and periodically exposed to the substrate for a first duration, and (b) form a second layer of silicon oxide on the first layer of silicon oxide at a second temperature through a second atomic layer deposition reaction, the first layer of silicon oxide and second layer of silicon oxide together forming the silicon oxide bilayer, where formation of the second layer of silicon oxide involves a second plasma generated at a second RF power and periodically exposed to the substrate for a second duration, where the first temperature is higher than the second temperature, where the first RF power is greater than the second RF power, where the first duration is greater than the second duration, and where the first layer of silicon oxide has a lower wet etch rate than the second layer of silicon oxide.

The controller may have instructions to deposit the bilayer such that the first layer represents about 20% or less of a total thickness of the silicon oxide bilayer.

In another aspect of the disclosed embodiments, an apparatus for forming silicon oxide film on a semiconductor substrate is provided, the apparatus including a reaction chamber, a plasma source for providing plasma in the reaction chamber, one or more inlets for providing a silicon-containing reactant and an oxygen-containing reactant to the reaction chamber; a substrate support for supporting the substrate within the reaction chamber; and a controller having instructions to deposit the silicon oxide film on the substrate according to any of the methods disclosed herein.

These and other features will be described below with reference to the associated drawings.

DETAILED DESCRIPTION

Figure 1A:
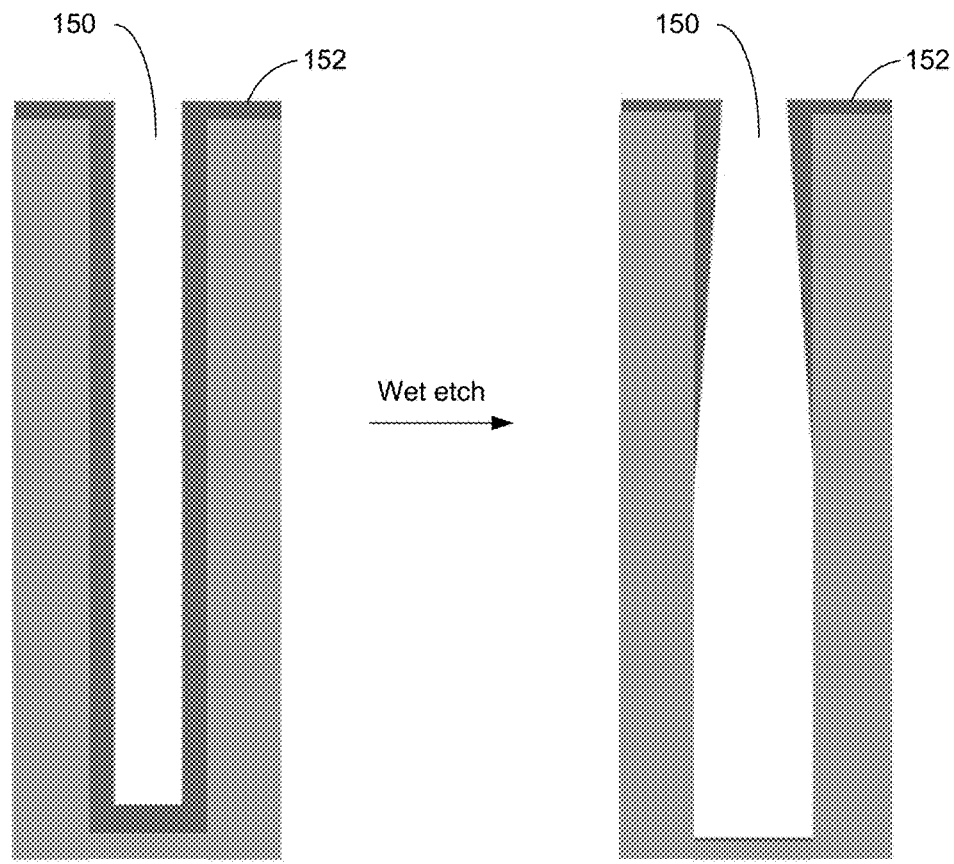
FIG. 1A shows a feature lined with silicon oxide having non-uniform film quality.

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. The flow rates and power levels given herein relate to those used with a four station reactor having four 300 mm wafers therein. The flow rates and power levels scale linearly based on substrate area. The following detailed description assumes the invention is implemented on a wafer. However, the invention is not so limited. The work piece may be of various shapes, sizes, and materials. In addition to semiconductor wafers, other work pieces that may take advantage of this invention include various articles such as printed circuit boards and the like.

In the following description, numerous specific details are set forth in order to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Manufacture of semiconductor devices typically involves depositing one or more thin films on a planar or non-planar substrate in an integrated fabrication process. In some aspects of the integrated process it may be useful to deposit thin films that conform to substrate topography. One type of reaction that is useful in some cases involves chemical vapor deposition (CVD). In typical CVD processes, gas phase reactants are introduced into a reaction chamber simultaneously and undergo a gas-phase reaction. The reaction products deposit on the surface of the substrate. The reaction may be driven by plasma, in which case the process may be referred to as a plasma enhanced chemical vapor deposition (PECVD) reaction. As used herein, the term CVD is intended to include PECVD unless otherwise indicated. CVD processes have certain disadvantages that render them less appropriate in some contexts. For instance, mass transport limitations of CVD gas phase reactions may cause "bread-loafing" deposition effects that show thicker deposition at top surfaces (e.g., top surfaces of gate stacks) and thinner deposition at recessed surfaces (e.g., bottom corners of gate stacks). Further, because some die may have regions of differing device density, mass transport effects across the wafer surface may result in within-die and within-wafer thickness variations. These thickness variations can result in over-etching of some regions and under-etching of other regions, which can degrade device performance and die yield. Another problem related to CVD processes is that they are often unable to form conformal films in high aspect ratio features. This issue is increasingly problematic as device dimensions continue to shrink.

Another type of reaction that is useful in many cases is atomic layer deposition (ALD). Whereas CVD processes primarily employ gas phase reactions to quickly deposit material on a substrate surface, ALD processes primarily involve surface-mediated reactions that deposit material in a much slower, cyclic manner. One type of ALD process is a plasma enhanced atomic layer deposition (PEALD) process, where the reaction is driven by exposure to plasma. In ALD processes, the reactants are delivered in a non-overlapping cyclic manner to minimize or eliminate unwanted gas phase reactions. A typical ALD reaction involves (1) exposing a substrate in a reaction chamber to a first gas phase reactant (e.g., a silicon-containing reactant) and allowing the reactant to adsorb onto the substrate surface, (2) purging the reaction chamber (e.g., by applying vacuum to evacuate the chamber or by flowing an inert gas to sweep the first reactant out of the chamber), (3) exposing the substrate to a second gas phase reactant (e.g., an oxygen-containing reactant or nitrogen-containing reactant), (4) exposing the substrate to an energy source (e.g., plasma or heat) to drive a surface reaction between the first reactant and the second reactant, and (5) purging the reaction chamber again. These steps may be repeated to build a film of desired thickness. In various cases, steps (3) and (4) overlap, wholly or partially, such that the second reactant is delivered to the reaction chamber while the substrate is exposed to plasma. ALD processes are also sometimes referred to as conformal film deposition (CFD) processes, particularly where no purge (or an incomplete purge) is done between steps (3) and (4), or where steps (3) and (4) overlap in time. As used herein, the term ALD includes thermal ALD, PEALD, and CFD unless otherwise indicated.

Depending on the exposure time of the precursor dosing steps and the sticking coefficients of the precursors, each ALD cycle may deposit a film layer of, in one example, between about 0.5-3 Å thick.

Methods for forming films using ALD/CFD are described in the following U.S. patent applications, each of which is herein incorporated by reference in its entirety: U.S. patent application Ser. No. 13/084,399, filed on Apr. 11, 2011; U.S. patent application Ser. No. 13/953,616, filed Jul. 29, 2013; U.S. patent application Ser. No. 14/074,596, filed Nov. 7, 2013; and U.S. patent application Ser. No. 14/144,107, filed Dec. 30, 2013.

Conventional PEALD processes result in the deposition of conformal films having substantially uniform thickness. However, although the films are uniform in thickness, they may not be uniform in quality. In some cases, the film deposited on the sidewall of a recessed feature is of poorer quality than the film deposited in the field region near the top of the feature or at the bottom of the feature. This poor quality is evidenced by a higher wet etch rate of the film at the sidewalls compared to the film near the top or bottom of the feature. A high wet etch rate correlates to less dense, lower quality film.

FIG. 1A shows a feature 150 that is lined with silicon oxide 152 deposited through conventional ALD methods. The left portion of the figure shows the silicon oxide 152 as deposited, and the right portion of the figure shows the silicon oxide 152 after performing a wet etch. The silicon oxide 152 etches fastest along the sidewalls of the feature 150, particularly near the bottom portion of the feature 150. This non-uniform in-feature wet etch rate is not ideal, and indicates a non-uniform film quality.

Without wishing to be bound by theory or mechanism of action, it is believed that the difference in film quality between the sidewalls of a feature and other areas of a feature in conventional PEALD methods may arise due to ion directionality. When a substrate is exposed to plasma, ions present in the plasma travel in a substantially linear manner to hit the surface of the substrate. These ions may provide energy for converting the precursor material(s) to a high quality film. Because the feature is recessed and the ions travel substantially linearly, the number of ions impacting the substrate is much higher near the field region of a feature, as compared to the bottom and sidewalls. The sidewalls and bottom are effectively shadowed due to the geometry of the feature. This difference may act to selectively densify the film near the top of the feature, leaving a less dense film on the sidewalls and bottom (especially the sidewalls). Further, the energy delivered by ions hitting the sidewalls and bottom is lower than the energy delivered by ions hitting other portions of the feature, again due to the geometry of the recessed feature. This may lead to different reactions happening at the sidewalls than at other regions. Another factor may be the relative amount of ions and radicals present in the plasma. The reaction parameters disclosed herein can be used to help mitigate these effects and produce a film having more uniform characteristics.

The processes described herein are used to produce silicon oxide films. Unless otherwise clear from context, the term silicon oxide is intended to cover stoichiometric and non-stoichiometric solid compositions of primarily silicon and oxygen. Silicon oxide films may have various morphologies, including varying degrees of crystallinity, roughness, etc.

Figure 1B:
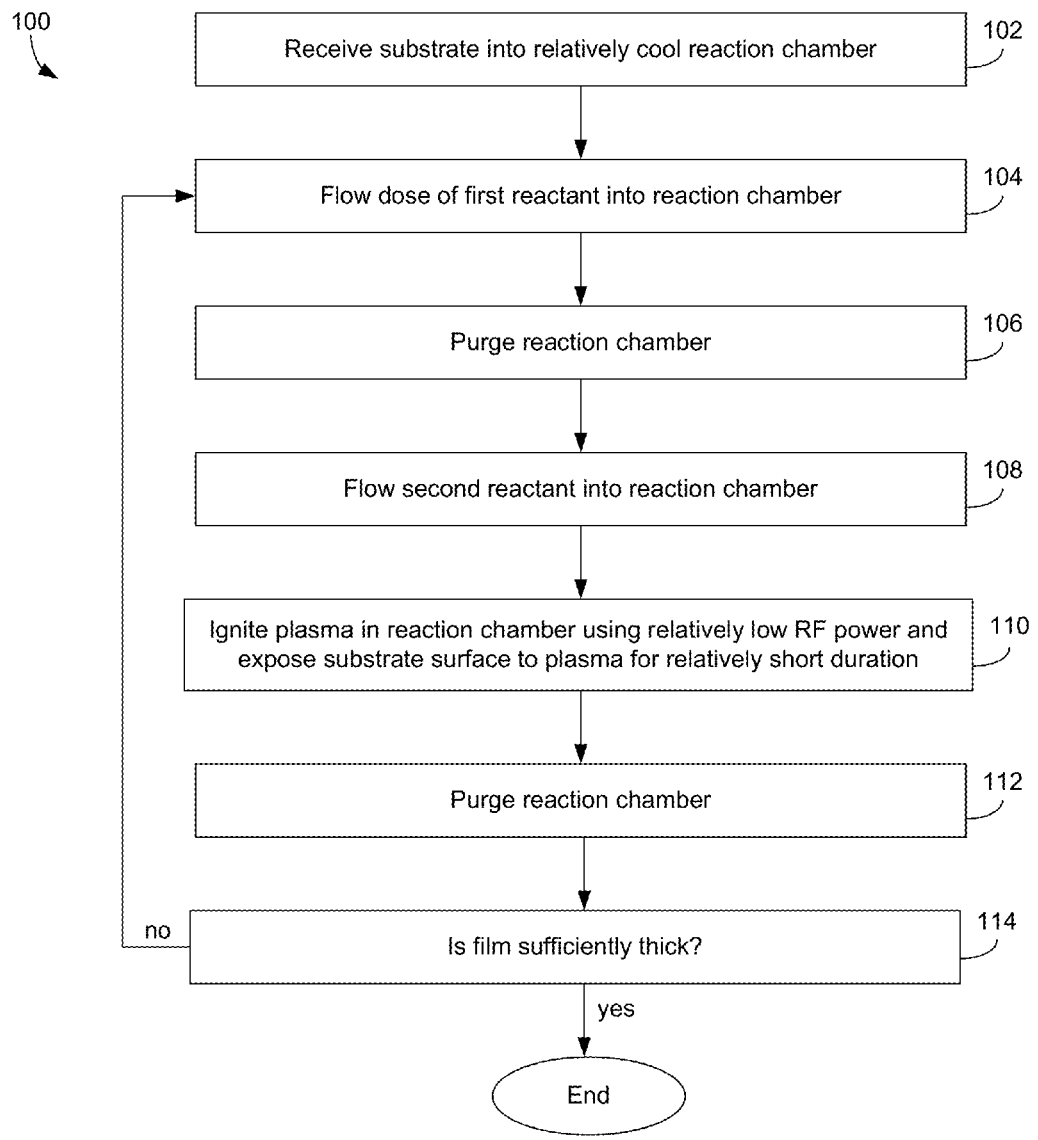
FIG. 1B illustrates a flow chart for a method of depositing film according to a baseline atomic layer deposition scheme.

FIG. 1B shows a flowchart for a method of depositing a film according to a baseline conventional ALD technique. The method 100 begins at operation 102, where a substrate is received into a reaction chamber. The reaction chamber may have a single station or a plurality of stations (e.g., 2 or 4 stations in some cases). The flow rates and power levels given herein assume that a four station reactor is used, with a 300 mm diameter wafer in each station. Many other setups are possible. The substrate will frequently be patterned to have a number of recessed features therein. In other cases the substrate may be unpatterned/flat. The substrate may be maintained at a temperature below about 400° C., for example between about 50-400° C., or between about 300-400° C. in some cases. This substrate temperature is relatively cool compared to certain disclosed embodiments. The reaction chamber may be maintained at a pressure between about 2-7 Torr.

At operation 104, a dose of a first reactant is flowed into the reaction chamber. The first reactant may be introduced at a rate between about 1-2 mL/min (based on the pre-vaporization volume of the reactant, assuming delivery to four 300 mm diameter wafers). This corresponds to a flow rate between about 3.5-7.1 mL/min per square meter of substrate area. As used herein, substrate area is calculated as the area of a single side of a wafer based on the radius of the wafer (i.e., the area of a single 300 mm wafer is $A=\pi r^2=70,700$ mm$^2$, or about 707 cm$^2$, or about 0.07 m$^2$ and the total substrate area over four stations is about 2830 cm$^2$, or about 0.28 m$^2$). The substrate area is not calculated to include additional surface area introduced due to features present on the wafer. The flow rates may be scaled linearly for substrates of other sizes. The first reactant may be introduced along with an inert carrier gas such as Ar or $N_2$. The flow rate of the carrier gas may be between about 5-10 SLM, which corresponds to a flow rate between about 17-36 SLM per square meter of substrate area. The duration over which the first reactant is introduced into the chamber may be less than about 1 second, for example between about 0.2-1 second. The reactant adsorbs onto the surface of the substrate, including in the recessed features, where applicable. Where the film being deposited contains silicon, the first reactant is typically a silicon-containing reactant.

Next, the reaction chamber is purged at operation 106. In some embodiments, the purge includes sweeping the reaction chamber with a non-reactive gas, for example Ar or $N_2$. The non-reactive gas may be delivered in a burst push, for example between about 20-40 SLM, which corresponds to about 70-140 SLM per square meter of substrate area. Alternatively or in addition, the purge may include evacuating the reaction chamber by performing a pump down. In this case, the pressure in the reaction chamber is significantly lower during the pump down than during reactant delivery, for example. The purge may have a duration between about 0.2-1 seconds. The purpose of this purge operation 106 is to remove all or substantially all of the non-adsorbed first reactant from the reaction chamber. In some embodiments, the purge/sweep may be less complete, where only a portion of the first reactant is removed from the reaction chamber. Optimal purge conditions may depend on the desired film characteristics. Unless otherwise stated, a sweep or purge as described herein may be partial, complete or substantially complete. In certain implementations, this purge/sweep may not occur.

Next, at operation 108, a second reactant is flowed into the reaction chamber. The second reactant is generally an oxygen-containing reactant. The second reactant may flow at a rate between about 10-20 SLM, which corresponds to a flow rate between about 35-71 SLM per square meter of substrate area. The second reactant may flow over a period having a duration between about 0.5-1 second.

Each of the first and second reactants may also be a mix of reactants. In one example, the second reactant may include both oxygen and nitrous oxide. Where more than one reactant is delivered to the reaction chamber at the same time, the reactants may be mixed prior to delivery (e.g., in a separate mixing vessel), or after delivery (e.g., in the reaction chamber itself).

At operation 110, a plasma is ignited in the reaction chamber and exposed to the substrate surface. In various embodiments, operations 108 and 110 occur, at least partially (and sometimes wholly) at the same time. In one particular example, the second reactant is provided continuously. In other embodiments, operations 108 and 110 begin at the same time. In some cases, the second reactant may be pre-flowed into the reaction chamber at 108 before plasma ignition occurs at 110. In certain embodiments, the second reactant is flowed into the reaction chamber at 108, then swept/purged from the reaction chamber before plasma ignition occurs at operation 110. In various cases, however, this purge may not occur. The plasma exposure step is also sometimes referred to as a conversion step, and as mentioned, it may overlap with delivery of the second reactant. The plasma exposure step may occur over a duration between about 0.5-1 second, which is relatively short compared to certain disclosed embodiments. The plasma may be generated using RF power in some cases, for example between about 2,000-5,000 Watts total divided among four stations, each having a 300 mm wafer therein. This corresponds to a total RF plasma power between about 0.7-1.8 Watts per square centimeter of substrate area. This RF power is relatively low compared to certain disclosed embodiments. The frequency used to generate the plasma may include a low frequency (LF) component (e.g., about 250-450 kHz) and/or a high frequency (HF) component (e.g., about 13.56 MHz or about 27 MHz). In various cases only HF frequency is used.

Next, the plasma is extinguished and the reaction chamber is purged at operation 112. As mentioned with respect to the purge at operation 106, this may include sweeping and/or pumping down the reaction chamber. Where a sweep is used, the chamber may be swept with a non-reactive gas such as Ar or $N_2$, which may flow at a rate between about 20-40 SLM, which corresponds to a flow rate between about 70-140 SLM per square meter of substrate area. The purge may have a duration between about 0.1-0.5 seconds in some cases. In certain cases this sweep/purge is not performed. Operations 104-112 may deposit a film having a thickness defined by the precursor adsorption characteristics (e.g., a monolayer or less of deposited material).

Next, at operation 114, the film thickness is monitored. If the film is sufficiently thick, the method 100 ceases and the substrate is ready for further processing. If the film is not yet sufficiently thick, the method 100 continues by repeating from operation 104. Additional iterations may then be performed to build the film to a desired thickness.

Where a multi-station reaction chamber is used, the substrate may travel through the different stations during deposition. The use of a multi-station reaction chamber is beneficial because it can help promote a high throughput and minimize costs. For instance, plasma generation equipment and plumbing lines can be shared between the multiple stations. Further, where multi-station reaction chambers are used, fewer pieces of processing equipment are required to achieve the same throughput, as each chamber can simultaneously process a number of substrates. Another advantage to multi-station reactors is that spatial non-uniformities can be minimized. Each station has certain non-uniformities that can affect the deposition results. Where a multi-station reaction chamber is used, the substrate may cycle through the different stations, and the non-uniformities from each station are balanced/minimized by the remaining stations. This cycling significantly helps improve wafer-to-wafer uniformity.

The multi-station reaction chamber may have two or more stations. In these or other cases, the reaction chamber may have about sixteen stations or less, for example about eight stations or less. In a particular example, four stations are used. A different substrate may be present at each station. The ALD cycles may be broken into phases, where the substrates transfer to a new station between each set of phases. Each phase includes a number of individual ALD cycles. In one example, about 2000 ALD cycles are performed on four different stations. The first 500 cycles may be performed in the first station, the next 500 cycles in the second station, the next 500 cycles in the third station, and the remaining 500 cycles may be performed in the fourth station, when considering a single substrate. Additional numbers of shorter phases may be used as well (e.g., 100 cycles in each phase/station). In this case the substrate may cycle through each station a number of times (e.g., at 2000 cycles total over four stations at 100 cycles per phase, each substrate will go through each station five times).

As indicated, the plasma characteristics can have a substantial effect on the deposited film. In many embodiments, the plasma is a capacitively coupled plasma. However, other types of plasma may also be used, for example inductively coupled plasmas. Various types of plasma generators may be used including RF, DC and microwave plasma generators. The plasma may be either a direct plasma (i.e., a plasma generated in the reaction chamber), or a remotely-generated plasma. FIG. 1B and the related description relates to an ALD process using a baseline process window. This process window utilizes a relatively low temperature, low RF power, and/or low RF time compared to certain disclosed embodiments.

Figure 1C:
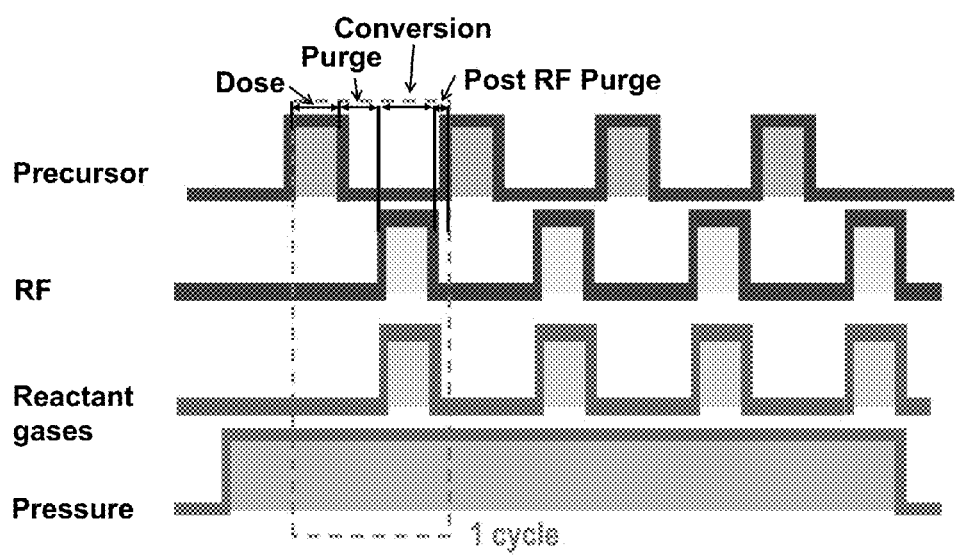
FIG. 1C depicts a timing diagram for performing atomic layer deposition reactions according to certain embodiments.

FIG. 1C presents a timing diagram illustrating certain operations in an ALD process such as the one depicted in FIG. 1B. In particular, FIG. 1C shows the flow of precursor (e.g., a first reactant such as a silicon-containing reactant), the flow of reactant gases (e.g., a second reactant such as an oxygen-containing reactant), the RF plasma activation, and the pressure in the chamber. Multiple phases are shown including a precursor dose phase, a purge phase, a conversion phase, and a post-RF purge phase. The portion included in the dotted line box represents a single ALD cycle. In this example, delivery of the reactant gas occurs simultaneously with activation of RF.

For context, some embodiments are described with reference to a "baseline process", which generally follows the process and conditions presented for FIGS. 1B and 1C. In such a baseline process, the first and second reactants are delivered to a four station reactor (e.g., a Vector® Extreme or Vector® Express reactor from Lam Research, Inc. of Fremont, Calif.), where they are reacted to produce silicon oxide films on 300 mm wafers. As explained, the disclosed embodiments are not limited to 300 mm wafers, and it will be understood by those of skill in the art that process conditions will have to be scaled from those stated for 300 mm wafers when wafers of other sizes are used.

In the baseline process, the wafer temperature is about 400° C. The pressure employed in the baseline process is about 5-6 Torr. The first reactant (silicon-containing reactant) is delivered at a flow rate of about 1-2 mL/min in Ar or $N_2$ carrier gas at about 5-10 SLM, and for a duration of 0.2-1 seconds. The flow of the first reactant is measured based on the pre-vaporization volume of the reactant. The second reactant is an oxidant such as oxygen and/or nitrous oxide, which is delivered at a flow rate of about 10-20 SLM, and for a duration of 0.5-1 seconds. Further, during the conversion phase of the baseline process, high frequency RF power is provided to generate the plasma at 13.56 MHz and about 5000 Watts. The plasma is left on for a duration of 0.5-1 seconds.

Disclosed improvements on the baseline process include (a) increasing the deposition temperature during at least the conversion phase, (b) increasing the exposure time during the conversion phase, and/or (c) increasing the plasma power during the conversion phase. Processes falling within the scope of these improvements do not require the exact baseline conditions described above. For example, they may be practiced using alternative first and second reactants, with a range of pressures (e.g., about 0.1-20 Torr), and/or within a range of RF frequencies (e.g., about 1-50 MHz). The above ranges are provided for a 4-station PECVD chamber equipped for depositing films on 300 mm silicon wafers. The flow rates and powers may have to be scaled as appropriate for reactors of other sizes. Other variations on the baseline process are disclosed below with reference to FIG. 2A, for example.

Figure 2A:
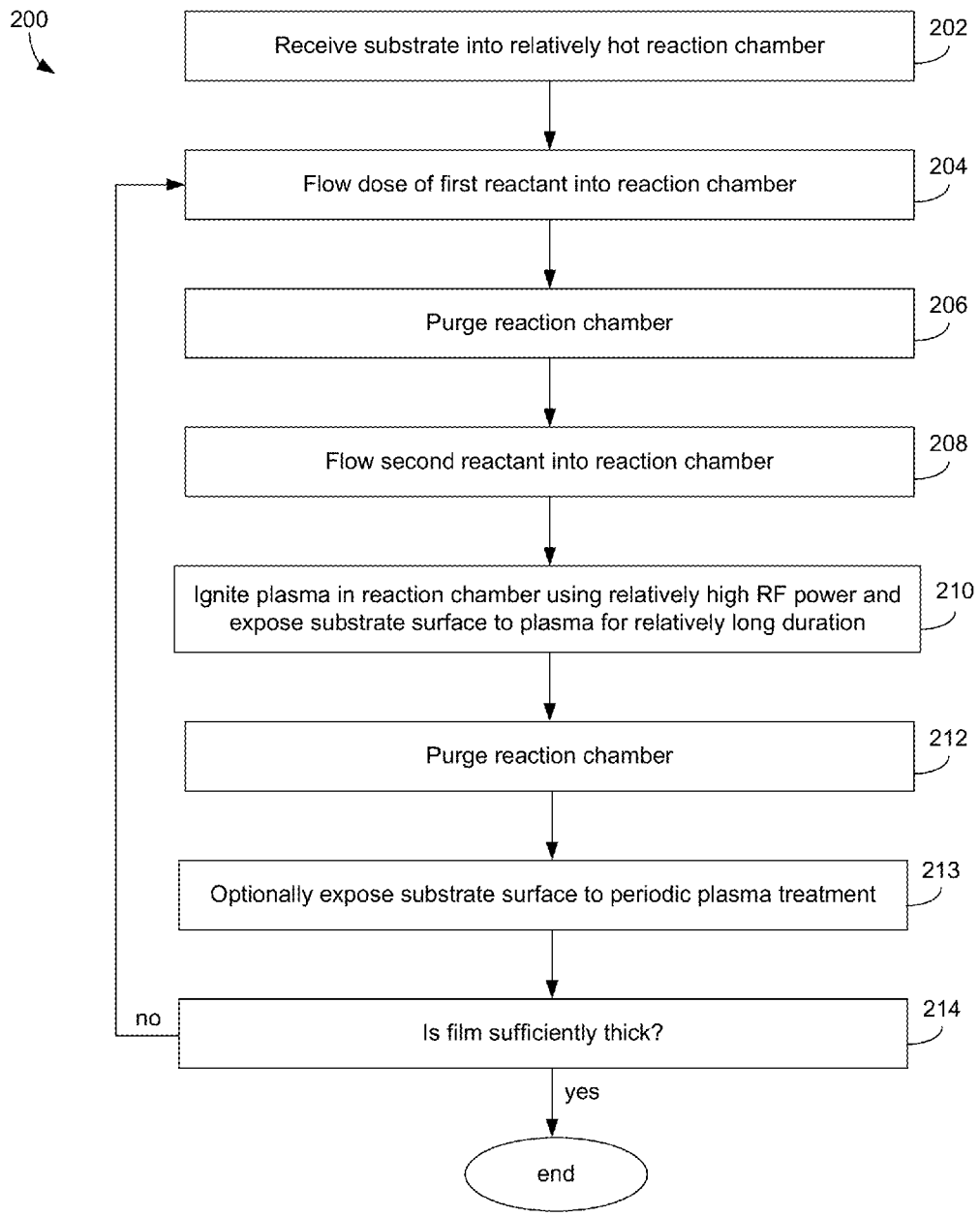
FIG. 2A illustrates a flow chart for a method of depositing film according to certain disclosed embodiments of an atomic layer deposition scheme.

FIG. 2A presents a flowchart for a method 200 of depositing a layer of material on a semiconductor substrate according to certain embodiments disclosed herein. As compared to the method 100 of FIG. 1B and the above baseline process, the method 200 of FIG. 2A utilizes a hotter substrate temperature, higher (HF) RF power, and a longer RF exposure time. Further, the method 200 of FIG. 2A utilizes an additional periodic plasma treatment step described further below.

The method 200 begins at operation 202, where a substrate is received into a reaction chamber. As mentioned, the reaction chamber may have a single station or a plurality of stations. The substrate will frequently be patterned to have a number of recessed features therein. In other cases the substrate may be unpatterned/flat. The substrate may be maintained at a temperature between about 435-550° C., for example between about 450-550° C., or between about 500-550° C. This substrate temperature is relatively hot compared to baseline methods. The reaction chamber may be maintained at a pressure between about 2-7 Torr.

At operation 204, a dose of a first reactant is flowed into the reaction chamber. The first reactant may be introduced at a rate between about 1-2 mL/min (based on the pre-vaporization volume of the reactant, assuming a single 300 mm diameter wafer). This corresponds to a flow rate between about 3.5-7.1 mL/min per square meter of substrate area. The first reactant may be introduced along with an inert carrier gas such as Ar or $N_2$. The flow rate of the carrier gas may be between about 5-10 SLM, which corresponds to a flow rate between about 17-36 SLM per square meter of substrate area. The duration over which the first reactant is introduced into the chamber may be less than about 1 second, for example between about 0.2-1 second. The first reactant is typically a silicon-containing reactant, which adsorbs onto the surface of the substrate.

Next, the reaction chamber is purged at operation 206. In some embodiments, the purge includes sweeping the reaction chamber with a non-reactive gas, for example Ar or $N_2$. As in the baseline method, the non-reactive gas may be delivered in a burst push, for example between about 20-40 SLM, which corresponds to about 70-140 SLM per square meter of substrate area. Alternatively or in addition, the purge may include evacuating the reaction chamber by performing a pump down. In this case, the pressure in the reaction chamber is significantly lower during the pump down than during reactant delivery, for example. The purge may have a duration between about 0.2-1 seconds.

Next, at operation 208, a second reactant is flowed into the reaction chamber. The second reactant is typically an oxygen-containing reactant. The second reactant may flow at a rate between about 10-20 SLM, which corresponds to a flow rate between about 35-71 SLM per square meter of substrate area. The second reactant may flow over a period having a duration between about 0.5-1 second. As mentioned with respect to the baseline method, each of the first and second reactants may also be a mix of reactants.

At operation 210, a plasma is ignited in the reaction chamber and exposed to the substrate surface. In various embodiments, operations 208 and 210 occur, at least partially (and sometimes wholly) at the same time. Operations 208 and 210 may begin at the same time, or at different times. In some cases, the second reactant may be pre-flowed into the reaction chamber at 208 before plasma ignition occurs at 210. The plasma exposure step may occur over a duration between about 2-5 seconds, which is relatively long compared to the baseline methods. The plasma may be generated using RF power in some cases, for example between about 6,000-10,000 Watts total divided among four stations, each having a 300 mm wafer therein. This corresponds to a total RF plasma power between about 2.1-3.6 Watts per square centimeter of substrate area. This RF power is relatively high compared to certain disclosed embodiments. In various embodiments, the RF power used to generate the plasma includes only HF frequencies (e.g., 13.56 MHz or 27 MHz). In certain cases, the RF power is provided at about 13.56 MHz, without any other frequencies.

Next, the plasma is extinguished and the reaction chamber is purged at operation 212. As mentioned with respect to the purge at operation 206, this may include sweeping and/or pumping down the reaction chamber. Where a sweep is used, the chamber may be swept with a non-reactive gas such as Ar or $N_2$, which may flow at a rate between about 20-40 SLM, which corresponds to a flow rate between about 70-140 SLM per square meter of substrate area. The purge may have a duration between about 0.1-0.5 seconds in some cases. In certain cases this sweep/purge may be optional, though the use of a post-plasma purge may help promote formation of high quality film. Operations 204-212 generally result in the deposition of a monolayer of material (or a saturated layer as determined by thermodynamics), though in certain embodiments, less than a monolayer of material may be deposited.

After the plasma is extinguished, an optional additional plasma treatment may be performed at operation 213. The plasma treatment may be undertaken to help promote complete oxidation and/or further densify the film. The plasma treatment may have the effect of eliminating dangling bonds (e.g., Si—H bonds) present on the film surface. As shown in the Experimental section, below, the plasma treatments promote formation of film having a lower wet etch rate, which correlates with higher quality film.

The plasma treatment is performed periodically. In certain cases, the additional plasma treatment is performed during each ALD cycle. However, this approach lengthens processing times and therefore lowers throughput. In certain implementations, a single plasma treatment can affect multiple layers of deposited material, so intermittent/periodic plasma treatments performed less frequently are sufficient. In some cases, the plasma treatment occurs once per every 5 or more cycles, for example once per every 10 or more cycles. In these or other cases, the plasma treatment may occur once per every 100 or less cycles, for example once per every 50 or less cycles. In a particular example the additional plasma treatment occurs about once per every 50 ALD cycles.

The gas used to generate the treatment plasma may be referred to as the treatment plasma generation gas. The treatment plasma generation gas may include oxygen, helium, and/or argon in some cases. In one example, substantially pure oxygen or substantially pure helium is used. In another example, a mixture of oxygen and argon is used. In this case, the relative volumetric flows of oxygen:argon may be between about 0.5:1 and 2:1. The flow rate of the treatment plasma generation gas may be between about 5-20 SLM, which corresponds to about 17-71 SLM per square meter of substrate area. The reaction chamber may be maintained at a pressure between about 2-6 Torr during the plasma treatment. Where the treatment plasma is generated through RF, the RF power may be between about 1,000-5,000 Watts total divided among four stations having 300 mm wafers. This corresponds to an RF power of about 0.3-1.8 Watts per square centimeter of substrate area. The frequency used to generate the plasma may include both LF and HF components. In certain cases the frequency may include only LF or only HF components.

The plasma treatment step occurs between ALD cycles. After the plasma is extinguished, the chamber may be purged (e.g., through a sweep and/or pump down) to push out any unwanted gas. This purge may be referred to as a pre-plasma treatment purge. The pre-plasma treatment purge may have a duration between about 5-30 seconds, for example about 20 seconds. Next, a line charge may be performed for a short period, between about 1-10 seconds (e.g., 3 seconds) to prime a gas delivery line with the treatment plasma generation gas. This may be done to stabilize the flow of the treatment plasma generation gas. After the line charge, a treatment plasma is ignited in the reaction chamber and the substrate is exposed to the treatment plasma for a duration between about 10-100 seconds, for example between about 15-60 seconds, or between about 20-35 seconds. In some embodiments, this additional periodic plasma treatment at operation 213 is omitted.

Next, at operation 214, the film thickness is monitored. If the film is sufficiently thick, the method 200 ceases and the substrate is ready for further processing. If the film is not yet sufficiently thick, the method 200 continues by repeating from operation 204. Additional iterations may then be performed to build the film to a desired thickness.

Where a multi-station reaction chamber is used, the substrates may travel through the different stations as described above.

The relatively high temperature, high RF power, long RF exposure duration, and periodic plasma treatments help promote formation of a dense, high quality film having a low wet etch rate and good electrical properties. For example, the wet etch rate of silicon oxide (in 300:1 BOE) may be between about 0.2-0.5 Å/second, for example between about 0.2-0.4 Å/second in some cases.

Films deposited according to the disclosed embodiments may have a dielectric constant between about 3.8-4.0. The film may have a BDV between about −7.6 and −12.7 MC/cm. The film may have a $V_{fb}$ between about −4.7 and −10.4 V. The film may have a leakage of less than about 7.6E-10 at 1 $MV/cm^2$, and/or a leakage of less than about 3.9E-10 at 2 $MV/cm^2$. These properties may be the average properties, for instance averaged over three points on the wafer (near the edge, at the center, and at a point mid-way between the center and edge). In some cases the film may have a $V_{fb}$ that varies by no more than about 1.3 V, for example by no more than about 1.3 V across the wafer.

As noted above, the first reactant is often a silicon-containing reactant and the second reactant (sometimes referred to as an auxiliary reactant) is often an oxygen-containing reactant.

Example silicon-containing reactants include, but are not limited to, silanes, halosilanes, and aminosilanes. A silane contains hydrogen and/or carbon groups, but does not contain a halogen. Examples of silanes are silane ($SiH_4$), disilane ($Si_2H_6$), and organo silanes such as methylsilane, ethylsilane, isopropylsilane, t-butylsilane, dimethylsilane, diethylsilane, di-t-butylsilane, allylsilane, sec-butylsilane, thexylsilane, isoamylsilane, t-butyldisilane, di-t-butyldisilane, tetra-ethyl-ortho-silicate (also known as tetra-ethoxysilane or TEOS) and the like. A halosilane contains at least one halogen group and may or may not contain hydrogens and/or carbon groups. Examples of halosilanes are iodosilanes, bromosilanes, chlorosilanes and fluorosilanes. Although halosilanes, particularly fluorosilanes, may form reactive halide species that can etch silicon materials, in certain embodiments described herein, the silicon-containing reactant is not present when a plasma is struck. Specific chlorosilanes are tetrachlorosilane ($SiCl_4$), trichlorosilane ($HSiCl_3$), dichlorosilane ($H_2SiCl_2$), monochlorosilane (Cl-$SiH_3$), chloroallylsilane, chloromethylsilane, dichloromethylsilane, chlorodimethylsilane, chloroethylsilane, t-butylchlorosilane, di-t-butylchlorosilane, chloroisopropylsilane, chloro-sec-butylsilane, t-butyldimethylchlorosilane, thexyldimethylchlorosilane, and the like. An aminosilane includes at least one nitrogen atom bonded to a silicon atom, but may also contain hydrogens, oxygens, halogens and carbons. Examples of aminosilanes are mono-, di-, tri- and tetra-aminosilane ($H_3Si(NH_2)_4$, $H_2Si(NH_2)_2$, $HSi(NH_2)_3$ and $Si(NH_2)_4$, respectively), as well as substituted mono-, di-, tri- and tetra-aminosilanes, for example, t-butylaminosilane, methylaminosilane, tert-butylsilanamine, bis(tertiarybutylamino)silane ($SiH_2(NHC(CH_3)_3)_2$ (BTBAS), tert-butyl silylcarbamate, $SiH(CH_3)$—$N(CH_3)_2)_2$, $SiHCl$—$(N(CH_3)_2)_2$, $(Si(CH_3)_2NH)_3$ and the like. A further example of an aminosilane is trisilylamine ($N(SiH_3)_3$). The silicon-containing reactant may also be a mixture of two or more of such reactants.

Examples of oxygen-containing reactants include oxygen, ozone, nitrous oxide, nitric oxide, nitrogen dioxide, carbon monoxide, carbon dioxide, sulfur monoxide, sulfur dioxide, water, oxygen-containing hydrocarbons ($C_xH_yO_z$), etc. The oxygen-containing reactant may also be a mixture of any two or more of such reactants.

Other precursors, such as will be apparent to or readily discernible by those skilled in the art given the teachings provided herein, may also be used. The disclosed process window may be used to achieve a high quality, high density layer of silicon oxide film.

In some embodiments, the additional plasma treatment and/or the disclosed process window (using high power RF for relatively long plasma exposures, performed at relatively high temperatures), may produce certain adverse effects on the film. As compared to the conventional/baseline method, the film formed through the disclosed methods may suffer from somewhat high within-wafer non-uniformity. Further, the disclosed process window and related additional plasma treatment may reduce throughput due to the longer RF plasma exposure durations used during the conversion step and the time it takes to perform the additional plasma treatments.

These issues may be addressed by forming a "bilayer" in certain embodiments. The bilayer approach allows for formation of a high quality interface with underlying layers while maximizing within-wafer uniformity and throughput. In other words, the bilayer approach may be used to address certain drawbacks related to the disclosed process window, such that high throughput and high uniformity are maintained despite the relatively harsh processing conditions used to deposit a portion of the bilayer.

Where a bilayer approach is used, a bottom layer may be deposited according to the disclosed techniques utilizing one or more (or all) of a high temperature, high plasma power, long plasma exposure duration, and additional plasma treatments, as described with relation to FIG. 2A. The bottom layer forms a high quality interface with the underlying layer, and may be used as a dielectric isolation layer (e.g., in deep trench and other contexts). The bottom layer film typically has very good electrical qualities such as breakdown voltage, flat band voltage, dielectric constant, and leakage. Example electrical properties that may be obtained in the bottom layer are provided above. The upper layer of the bilayer may be deposited according to conventional processing methods, for example using the baseline process described with relation to FIG. 1B. The upper layer helps improve within-wafer uniformity because the baseline process typically provides better uniformity than the process of FIG. 2A. The upper layer of the bilayer may be used to completely fill a gap that is lined by the bottom layer of the bilayer. This bilayer approach improves throughput because only a portion of the overall bilayer is deposited according to the disclosed scheme that involves longer RF times and optional additional plasma treatments. The high quality bottom layer may occupy between about 5-25%, for example between about 10-20%, of the total thickness of the bilayer. The bilayer may have a total thickness between about 700-1000 Å in some embodiments (e.g., in the context of forming a 3D-NAND structure or TSV structure).

Figure 2B:
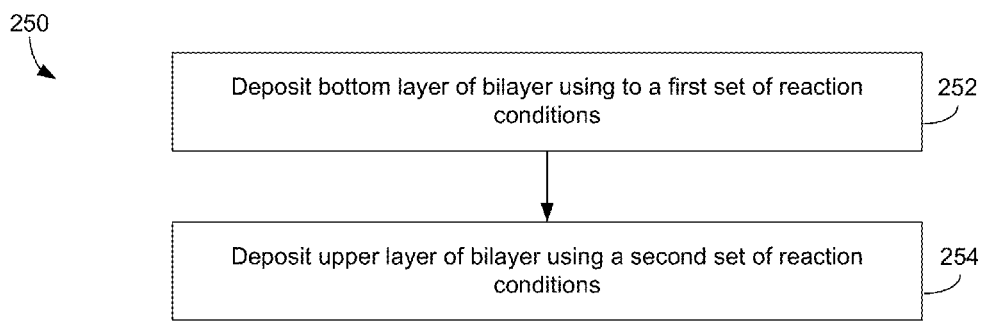
FIG. 2B illustrates a flow chart for a method of depositing a bilayer of material according to certain embodiments.

FIG. 2B provides a flowchart for a method of depositing a bilayer film on a substrate. A bottom layer of the bilayer may be deposited according to the disclosed techniques described above (e.g., utilizing one or more of high substrate temperature, high RF power, long RF exposure duration, and additional plasma treatments), and a top layer of the bilayer may be deposited according to the baseline techniques described above (e.g., using one or more of a relatively lower substrate temperature, lower RF power, shorter RF exposure duration, with or without additional plasma treatments).

The method 250 begins at operation 252, where a bottom layer of film is deposited using a first set of ALD reaction conditions designed to create a high quality, dense film having a low wet etch rate. The reaction may proceed according to the method 200 of FIG. 2A, for example. Generally speaking, the bottom layer of the bilayer may be formed using (1) a relatively high temperature (e.g., between about 435-550° C., or between about 450-550° C., or between about 500-550° C.), and/or (2) a relatively high RF power (e.g., between about 6,000-10,000 Watts total among four stations, corresponding to 2.1-3.6 Watts per square centimeter of substrate area), and/or (3) a relatively long RF exposure duration (e.g., between about 2-5 seconds per cycle), and/or (4) additional periodic plasma treatments as described herein.

The method 250 continues at operation 254, where a top layer of film is deposited using a second set of ALD reaction conditions designed to create a highly uniform film at a relatively higher throughput compared to the bottom layer of the bilayer. This portion of the deposition may proceed according to the method 100 of FIG. 1B, for example. As compared to the bottom layer, the top layer may be formed using (1) a relatively low temperature (e.g., below about 400° C., for example between about 50-400° C., or between about 300-400° C.), and/or (2) a relatively low RF power (e.g., between about 2,000-5,000 Watts divided among four stations, corresponding to about 0.7-1.8 Watts per square centimeter of substrate area), and/or (3) a relatively short RF exposure duration (e.g., between about 0.5-1 second). Additional plasma treatments, as described with relation to operation 213 of FIG. 2A, may or may not be performed during formation of the top layer of the bilayer. In some cases the plasma treatments are omitted to help maximize throughput. In other cases the plasma treatments may be used to help ensure desired electrical or other properties in the final bilayer. The top layer of film may occupy between about 75-95% of the total thickness of the bilayer, for example between about 80-90% of the total thickness.

It is expected that the disclosed embodiments will be beneficial in achieving uniform film quality in recessed features. However, the methods may also be used to deposit films on other types of substrates (e.g., flat substrates, or substrates having protruding features). The need for the improved sidewall quality and overall film uniformity may not be as great in the context of these types of non-recessed substrates.

In some embodiments, the substrate includes one or more recessed features having aspect ratios of about 10:1 or higher. In these or other cases, the aspect ratio of the feature may be about 30:1 or lower, for example about 25:1 or lower, or about 20:1 or lower. This ratio is defined as the depth:width of the recessed feature. In other cases, the aspect ratio of the features may be higher or lower than the disclosed values. Features having aspect ratios between about 10:1 and 20:1 are expected to see the greatest benefit from the disclosed embodiments, though even flat wafers may benefit as well. In some cases the width of the recessed feature may be between about 2-100 μm, for example between about 5-50 μm, or between about 5-20 μm.

The film formed according to the disclosed embodiments may have an average wet etch rate relative to thermally grown silicon oxide between about 1.2-1.6, for example between about 1.24-1.59 in some cases. Where the film is formed in a trench or other recessed feature, the average wet etch rate is calculated as the average of the wet etch rates at the top, top corner, middle portion of the sidewall, and bottom of the feature (i.e., these four WERs are averaged together). The middle portion of the sidewall may have a wet etch rate relative to thermally grown silicon oxide between about 1.1-1.5, for example between about 1.14-1.46 in some cases. The ratio between the WER at the middle portion of the sidewall of the feature and the WER at the top of the feature ($WER_{sidewall}/WER_{top}$) may be between about 1.05-1.1, for example between about 1.06-1.09 in some cases. In other cases, this ratio ($WER_{sidewall}/WER_{top}$) is below about 1, for example between about 0.9-1, or between about 0.9-0.95. After etching (e.g., in 300:1 BOE, 150 seconds), the top portion of the feature may have at least about 77% remaining, the top corner of the feature may have at least about 43% remaining, the middle portion of the sidewall may have at least about 78% remaining, and/or the bottom portion of the feature may have at least about 84% remaining, when considering the remaining film thickness compared to the initial film thickness.

Apparatus

A suitable apparatus for performing the disclosed methods typically includes hardware for accomplishing the process operations and a system controller having instructions for controlling process operations in accordance with the present embodiments. For example, in some embodiments, the hardware may include one or more PEALD process stations included in a process tool having a controller.

Figure 3:
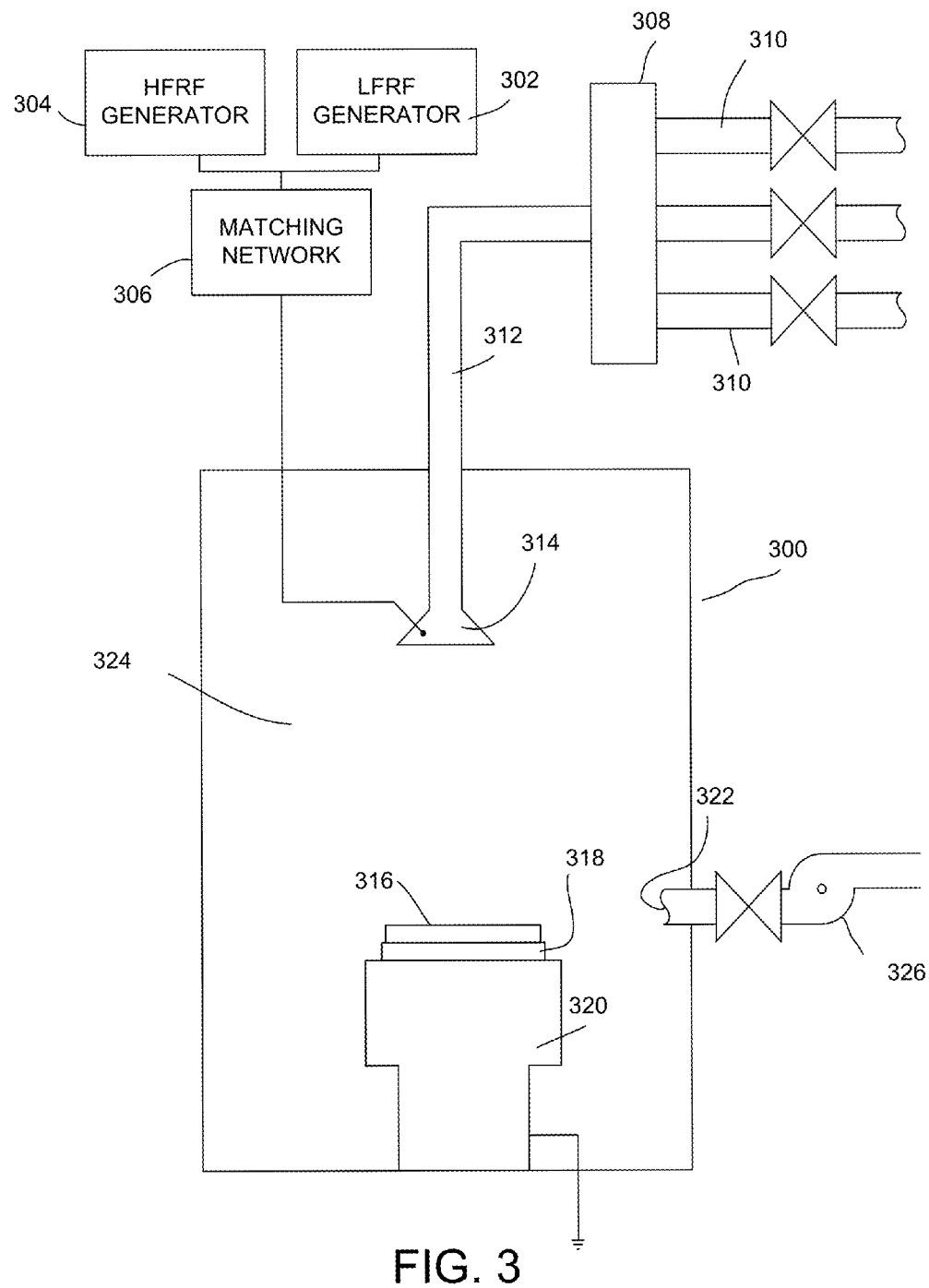
FIG. 3 depicts a simplified view of a single station reaction chamber according to certain embodiments.

FIG. 3 provides a block diagram of an example apparatus that may be used to practice the disclosed embodiments. As shown, a reactor 300 includes a process chamber 324, which encloses other components of the reactor and serves to contain the plasma generated by, e.g., a capacitor type system including a showerhead 314 working in conjunction with a grounded heater block 320. A high-frequency RF generator 304, connected to a matching network 306, and a low-frequency RF generator 302 are connected to showerhead 314. The power and frequency supplied by matching network 306 is sufficient to generate a plasma from the process gas. In one implementation of the present invention both the HFRF generator and the LFRF generator are used. In a typical process, the high frequency RF component is generally between about 2-60 MHz; in a preferred embodiment, the HF component is about 13.56 MHz or 27 MHz. The low frequency LF component is generally between about 250-400 kHz; in a particular embodiment, the LF component is about 350 kHz.

Within the reactor, a wafer pedestal 318 supports a substrate 316. The pedestal typically includes a chuck, a fork, and/or lift pins to hold and transfer the substrate during and between the deposition and/or plasma treatment reactions. The chuck may be an electrostatic chuck, a mechanical chuck or various other types of chuck as are available for use in the industry and/or research.

The process gases are introduced via inlet 312. Multiple source gas lines 310 are connected to manifold 308. The gases may be premixed or not. Appropriate valving and mass flow control mechanisms are employed to ensure that the correct gases are delivered during the deposition and plasma treatment phases of the process. In the case that the chemical precursor(s) are delivered in liquid form, liquid flow control mechanisms are employed. The liquid is then vaporized and mixed with other process gases during its transportation in a manifold heated above its vaporization point before reaching the deposition chamber.

Process gases exit chamber 300 via an outlet 322. A vacuum pump 326 (e.g., a one or two stage mechanical dry pump and/or a turbomolecular pump) typically draws process gases out and maintains a suitably low pressure within the reactor by a close loop controlled flow restriction device, such as a throttle valve or a pendulum valve.

The invention may be implemented on a multi-station or single station tool. In specific embodiments, the 300 mm Novellus Vector™ tool having a 4-station deposition scheme or the 200 mm Sequel™ tool having a 6-station deposition scheme are used. The embodiments may also be practiced on apparatus designed to process 450 mm substrates or other sized substrates. It is possible to index the wafers after every deposition and/or post-deposition plasma treatment until all the required depositions and treatments are completed, or multiple depositions and treatments can be conducted at a single station before indexing the wafer. It has been shown that film stress is the same in either case. However, conducting multiple depositions/treatments on one station is substantially faster than indexing following each deposition and/or treatment.

Figure 4:
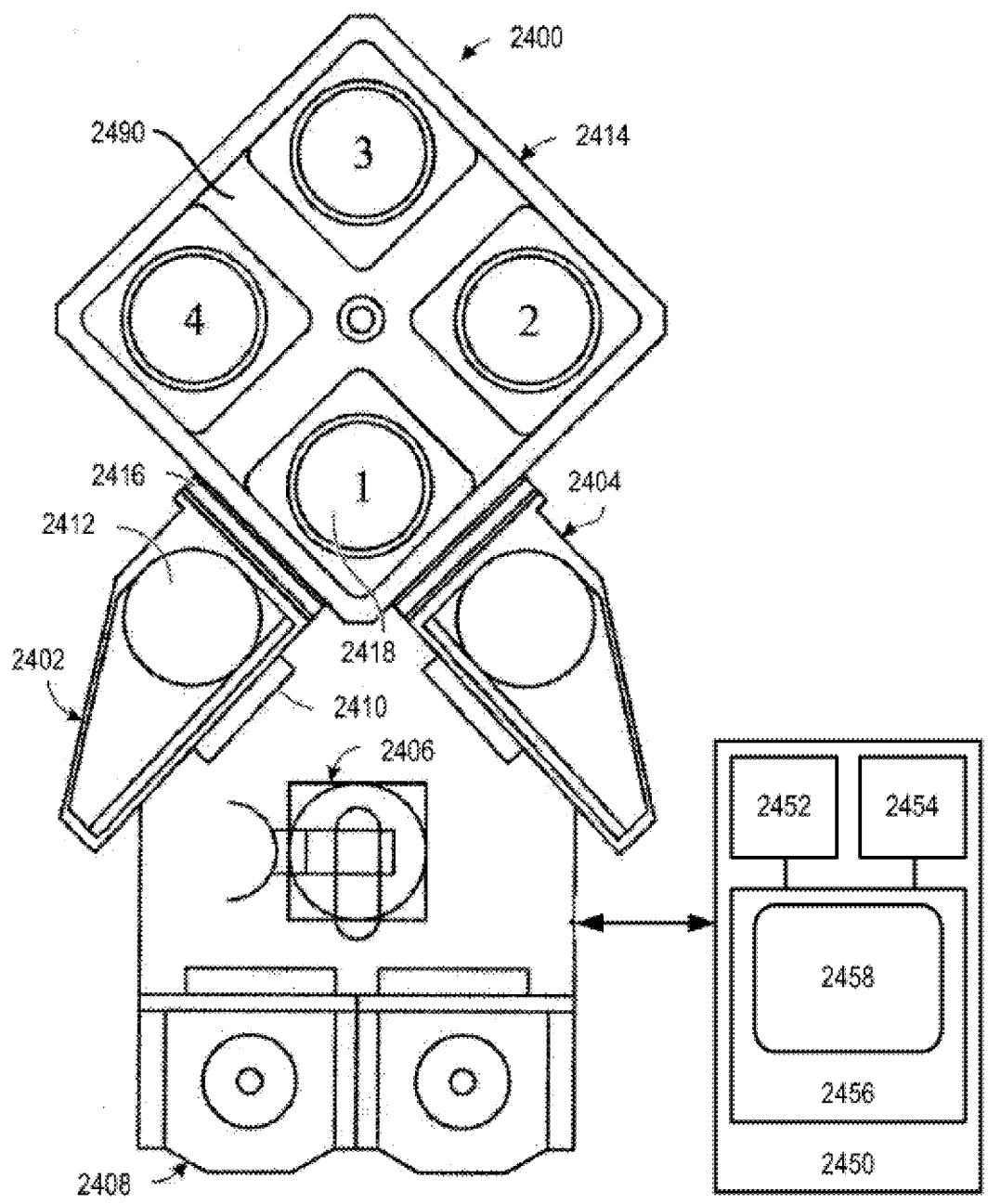
FIG. 4 shows a multi-tool semiconductor processing apparatus for depositing a film on a substrate in accordance with certain disclosed embodiments.

FIG. 4 shows a schematic view of an embodiment of a multi-station processing tool 2400 with an inbound load lock 2402 and an outbound load lock 2404, either or both of which may comprise a remote plasma source. A robot 2406, at atmospheric pressure, is configured to move wafers from a cassette loaded through a pod 2408 into inbound load lock 2402 via an atmospheric port 2410. A wafer is placed by the robot 2406 on a pedestal 2412 in the inbound load lock 2402, the atmospheric port 2410 is closed, and the load lock is pumped down. Where the inbound load lock 2402 comprises a remote plasma source, the wafer may be exposed to a remote plasma treatment in the load lock prior to being introduced into a processing chamber 2414. Further, the wafer also may be heated in the inbound load lock 2402 as well, for example, to remove moisture and adsorbed gases. Next, a chamber transport port 2416 to processing chamber 2414 is opened, and another robot (not shown) places the wafer into the reactor on a pedestal of a first station shown in the reactor for processing. While the embodiment depicted in FIG. 4 includes load locks, it will be appreciated that, in some embodiments, direct entry of a wafer into a process station may be provided.

The depicted processing chamber 2414 comprises four process stations, numbered from 1 to 4 in the embodiment shown in FIG. 4. Each station has a heated pedestal (shown at 2418 for station 1), and gas line inlets. It will be appreciated that in some embodiments, each process station may have different or multiple purposes. While the depicted processing chamber 2414 comprises four stations, it will be understood that a processing chamber according to the present disclosure may have any suitable number of stations. For example, in some embodiments, a processing chamber may have five or more stations, while in other embodiments a processing chamber may have three or fewer stations.

FIG. 4 also depicts an embodiment of a wafer handling system 2490 for transferring wafers within processing chamber 2414. In some embodiments, wafer handling system 2490 may transfer wafers between various process stations and/or between a process station and a load lock. It will be appreciated that any suitable wafer handling system may be employed. Non-limiting examples include wafer carousels and wafer handling robots. FIG. 4 also depicts an embodiment of a system controller 2450 employed to control process conditions and hardware states of process tool 2400. System controller 2450 may include one or more memory devices 2456, one or more mass storage devices 2454, and one or more processors 2452. Processor 2452 may include a CPU or computer, analog and/or digital input/output connections, stepper motor controller boards, etc.

In some embodiments, system controller 2450 controls all of the activities of process tool 2400. System controller 2450 executes system control software 2458 stored in mass storage device 2454, loaded into memory device 2456, and executed on processor 2452. System control software 2458 may include instructions for controlling the timing, mixture of gases, chamber and/or station pressure, chamber and/or station temperature, purge conditions and timing, wafer temperature, RF power levels, RF frequencies, substrate, pedestal, chuck and/or susceptor position, and other parameters of a particular process performed by process tool 2400. System control software 2458 may be configured in any suitable way. For example, various process tool component subroutines or control objects may be written to control operation of the process tool components necessary to carry out various process tool processes in accordance with the disclosed methods. System control software 2458 may be coded in any suitable computer readable programming language.

In some embodiments, system control software 2458 may include input/output control (IOC) sequencing instructions for controlling the various parameters described above. For example, each phase of a PEALD process may include one or more instructions for execution by system controller 2450. The instructions for setting process conditions for a PEALD process phase may be included in a corresponding PEALD recipe phase. In some embodiments, the PEALD recipe phases may be sequentially arranged, so that all instructions for a PEALD process phase are executed concurrently with that process phase.

Other computer software and/or programs stored on mass storage device 2454 and/or memory device 2456 associated with system controller 2450 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 2418 and to control the spacing between the substrate and other parts of process tool 2400.

A process gas control program may include code for controlling gas composition and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate. The heater control program may include instructions to maintain the temperature of the substrate within any of the disclosed ranges.

A plasma control program may include code for setting RF power levels and frequencies applied to the process electrodes in one or more process stations, for example using any of the RF power levels disclosed herein. The plasma control program may also include code for controlling the duration of each plasma exposure as disclosed above.

In some embodiments, there may be a user interface associated with system controller 2450. The user interface may include a display screen, graphical software displays of the apparatus and/or process conditions, and user input devices such as pointing devices, keyboards, touch screens, microphones, etc.

In some embodiments, parameters adjusted by system controller 2450 may relate to process conditions. Non-limiting examples include process gas composition and flow rates, temperature, pressure, plasma conditions (such as RF power levels, frequency, and exposure time), etc. These parameters may be provided to the user in the form of a recipe, which may be entered utilizing the user interface.

Signals for monitoring the process may be provided by analog and/or digital input connections of system controller 2450 from various process tool sensors. The signals for controlling the process may be output on the analog and digital output connections of process tool 2400. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 2450 may provide program instructions for implementing the above-described deposition processes. The program instructions may control a variety of process parameters, such as DC power level, RF power level, RF frequency, RF plasma exposure duration, pressure, temperature, etc. The instructions may control the parameters to operate in-situ deposition of film stacks according to various embodiments described herein.

The various hardware and method embodiments described above may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility.

Lithographic patterning of a film typically comprises some or all of the following steps, each step enabled with a number of possible tools: (1) application of photoresist on a workpiece, e.g., a substrate having a silicon nitride film formed thereon, using a spin-on or spray-on tool; (2) curing of photoresist using a hot plate or furnace or other suitable curing tool; (3) exposing the photoresist to visible or UV or x-ray light with a tool such as a wafer stepper; (4) developing the resist so as to selectively remove resist and thereby pattern it using a tool such as a wet bench or a spray developer; (5) transferring the resist pattern into an underlying film or workpiece by using a dry or plasma-assisted etching tool; and (6) removing the resist using a tool such as an RF or microwave plasma resist stripper. In some embodiments, an ashable hard mask layer (such as an amorphous carbon layer) and another suitable hard mask (such as an antireflective layer) may be deposited prior to applying the photoresist.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above described processes may be changed.

The subject matter of the present disclosure includes all novel and nonobvious combinations and sub-combinations of the various processes, systems and configurations, and other features, functions, acts, and/or properties disclosed herein, as well as any and all equivalents thereof.

EXPERIMENTAL

Experimental results have shown that the disclosed process window may be used to deposit high quality films having low wet etch rates and good electrical properties.

Figure 5:
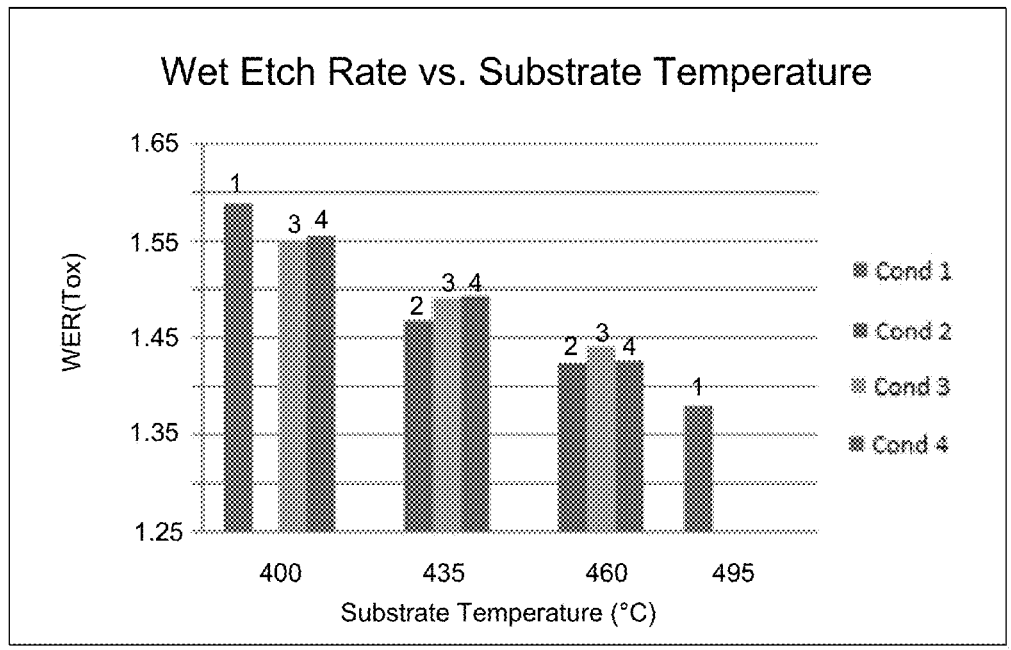
FIG. 5 depicts a graph showing the wet etch rate for films produced at different temperatures.

FIG. 5 shows the wet etch rate (relative to thermally grown silicon oxide) of silicon oxide films deposited at four different substrate temperatures for various sets of deposition conditions. The conditions 1-4 relate to particular RF power levels, RF plasma exposure duration, pressures, and certain flow rates, as shown in Table 1. Other reaction parameters were constant between the different conditions. The conditions are labeled at the top of each bar in the graph for clarity.

TABLE 1

|  | Condition 1 | Condition 2 | Condition 3 | Condition 4 |
| --- | --- | --- | --- | --- |
| Total RF Power (W) | 5000 | 6000 | 6000 | 6000 |
| RF plasma exposure duration (s) | 0.5 | 1 | 1 | 1 |
| Pressure (Torr) | 6 | 5 | 5 | 5 |
| O2 flow (SLM) | 10 | 10 | 2 | 10 |
| Ar flow (SLM) | 0 | 0 | 8 | 10 |

Not all conditions were tested at each temperature. As shown in the figure, increasing substrate temperature leads to lower wet etch rates in the resulting film. For instance, compared to the baseline conventional process at 400° C., the 435° C. cases show about a 4% reduction to the wet etch rate, the 460° C. cases show about an 8% reduction to the wet etch rate, and the 495° C. case shows about a 13% reduction to the wet etch rate. This correlation suggests that higher substrate temperatures may result in higher quality films.

Figure 6:
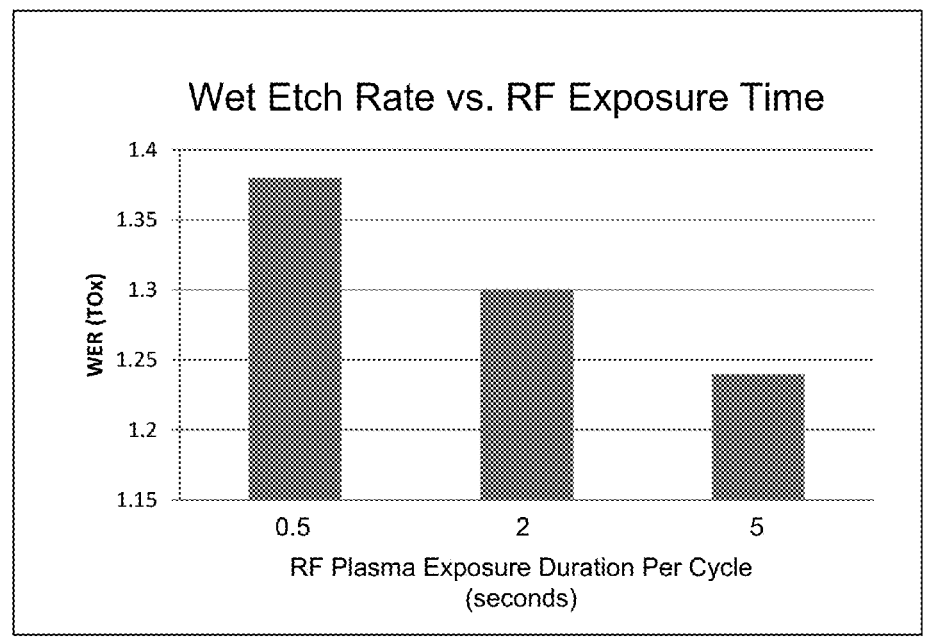
FIG. 6 depicts a graph showing the wet etch rate for films produced at different RF plasma exposure times.

FIG. 6 shows a graph illustrating the wet etch rate of silicon oxide film (relative to thermally grown silicon oxide) for different durations of RF plasma exposure. Longer RF plasma exposure durations result in lower wet etch rates. Further, the films deposited at longer RF exposure durations showed less compressive stress. One drawback to longer RF exposure is increased non-uniformity in terms of film thickness (both within-wafer and wafer-to-wafer non-uniformity). In particular, longer RF exposure durations resulted in film profiles having thicker and more tilted edges.

Additional films were formed and tested using the disclosed optional plasma treatments. Each tested plasma treatment was performed once per every 50 ALD cycles, for a duration of about 30 seconds, at a pressure of about 4 Torr, using an RF power of about 2500 Watts divided among four stations, each station having a 300 mm wafer therein. A first plasma treatment involved exposing the substrate to helium plasma. A second plasma treatment involved exposing the substrate to oxygen plasma. A third plasma treatment involved exposing the substrate to an oxygen/argon plasma (oxygen:argon delivered at a 2:1 ratio). The films treated with the plasma treatments show slightly lower compressive stress, and lower wet etch rates. The film treated with the helium plasma also showed a higher refractive index (RI), which indicates a denser film.

Another film was deposited as a bilayer. The bottom layer the bilayer was about 150 Å thick, deposited at high RF power (6000 W among four stations), long RF exposure (2 seconds), and high temperature (495° C.), with a helium plasma treatment every 50 ALD cycles. The top layer of the bilayer was about 850 Å thick, deposited according to the baseline process window, without additional plasma treatments. The bilayer showed very good results in terms of wet etch rate, electrical properties, and uniformity (wafer-to-wafer and within-wafer). The uniformity in the bilayer case was improved compared to cases where the entire film was deposited according to the disclosed process window.

Fourier transform infrared spectroscopy (FTIR) was performed on many of the deposited films. For all cases, the films advantageously show no signal relating to OH bonds (which would be found at a wavenumber of about 3000 cm$^{-1}$). This suggests that the disclosed plasma treatments do not degrade the film. Further, the data show that the signal relating to Si—O—Si bonds (stretching) is enhanced where higher temperatures and/or longer RF exposure times are used. The signal enhancement is evidenced by an increase in absorbance and peak wavenumber. The films that were deposited using the optional plasma treatments were also subjected to FTIR analysis. While the oxygen and oxygen/argon plasma treatments did show an impact on the FTIR results, the helium plasma treatment reduces the Si—O—Si signal.

Each film was also tested for its electrical properties including breakdown voltage (BDV), flatband voltage ($V_{fb}$), dielectric constant (k), and leakage. Each film was tested at three points on the wafer (edge, center, and a point between the edge and center). The electrical properties (BDV, $V_{fb}$ and leakage), as well as the within-wafer uniformity of the electrical properties, improve with higher temperatures and longer RF exposure durations. The oxygen and oxygen/argon plasma treatments improved the leakage and within-wafer electrical uniformity, as evidenced by a tight distribution of $V_{fb}$ across the wafer. The oxygen/argon plasma treatment resulted in a film having excellent uniformity of electrical properties. The film formed with periodic helium plasma treatments showed slightly worse electrical properties, with a lower BDV, higher leakage and larger range of $V_{fb}$ across the wafer as compared to the other plasma treatments.

Figure 7A:
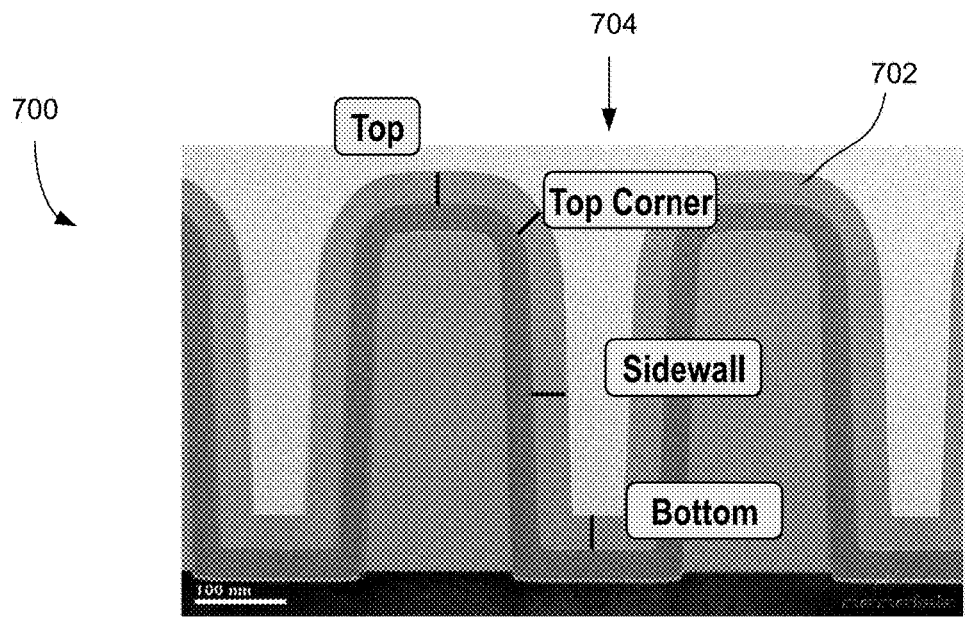
FIGS. 7A-7D illustrate silicon oxide films as-deposited and after etching for various deposition conditions.
Figure 7A:
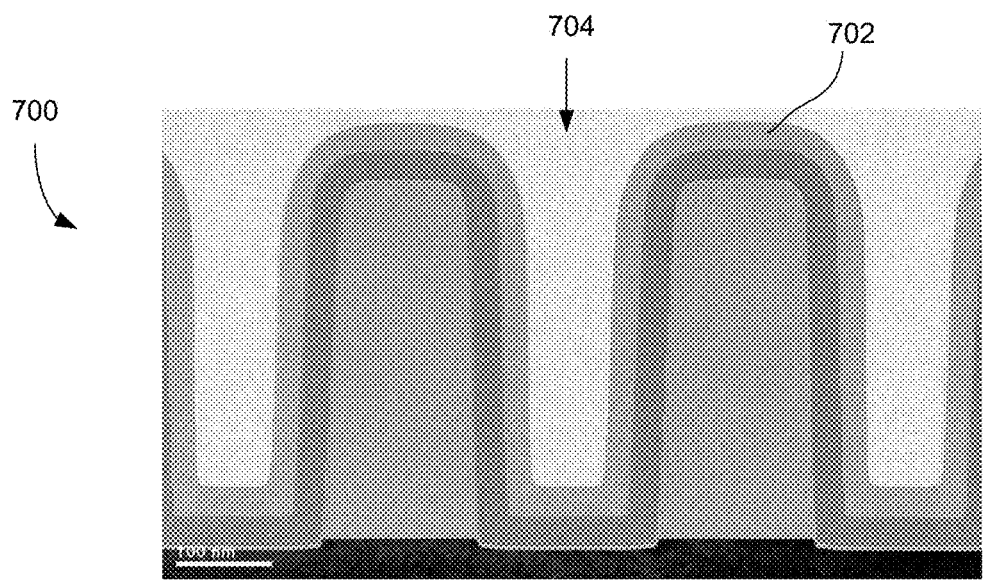

FIG. 7A presents two images of a test wafer 700 having a layer of silicon oxide 702 deposited thereon. The test wafer includes a number of trenches 704 lined by the silicon oxide 702. The top, top corner, sidewall, and bottom locations are noted on the figure. The silicon oxide 702 was deposited according to the baseline process window at 400° C., using a total RF power of 5,000 Watts among four stations, and an RF exposure duration of 0.5 seconds. The image shown in the top panel of FIG. 7A shows the test wafer 700 after the silicon oxide 702 is deposited. The image shown in the bottom panel of FIG. 7A shows the test wafer 700 after the silicon oxide 702 has been exposed to a wet etching process. The etching process involved dipping the test wafer 700 in buffered oxide etch (BOE) solution (300:1 BOE:water) for a period of about 150 seconds.

Table 2 describes the etching results related to the test wafer 700 shown in FIG. 7A.

TABLE 2

|  | Top | Top Corner | Sidewall | Bottom |
| --- | --- | --- | --- | --- |
| Thickness as deposited (Å) | 356.7 | 317.1 | 377.2 | 380.1 |
| Thickness after | 289.5 | 237.8 | 277.6 | 306.6 |

TABLE 2-continued

|  | Top | Top Corner | Sidewall | Bottom |
|---|---|---|---|---|
| etching (Å) |  |  |  |  |
| Amount etched (Å) | 67.3 | 79.4 | 99.6 | 73.6 |
| Wet etch rate (WER) (Å/sec) | 0.45 | 0.53 | 0.66 | 0.49 |
| Ratio of WER to WER at feature top | 100% | 118% | 148% | 109% |

The WER at the sidewall was very high compared to the WER at other portions of the film. The top portion of the film showed the lowest wet etch rate, followed by the bottom portion, then the top corner, and finally the sidewall.

Figure 7B:
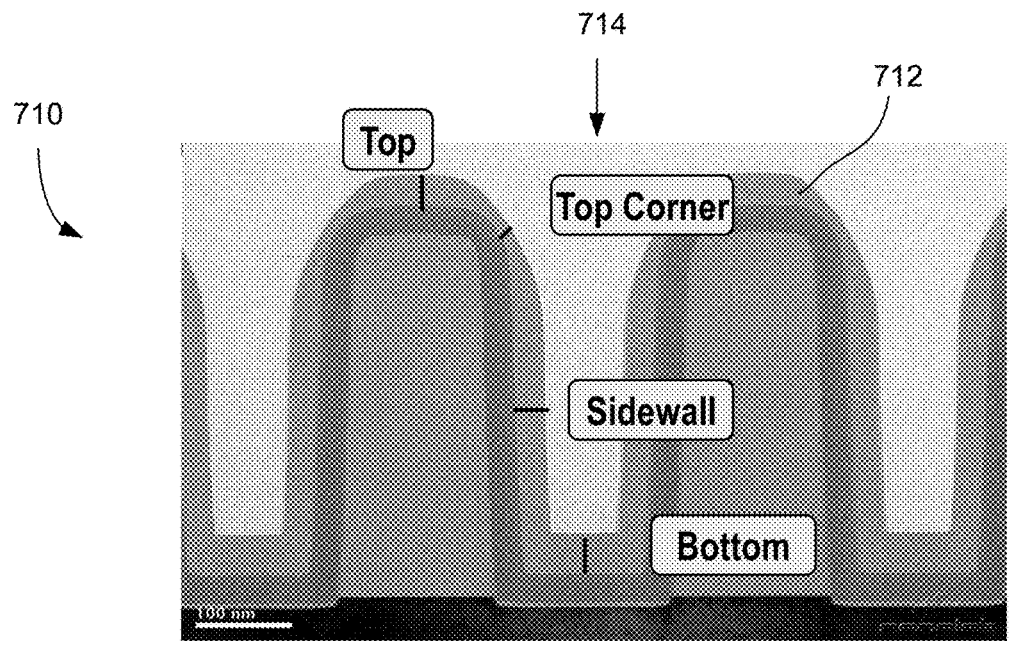
Figure 7B:
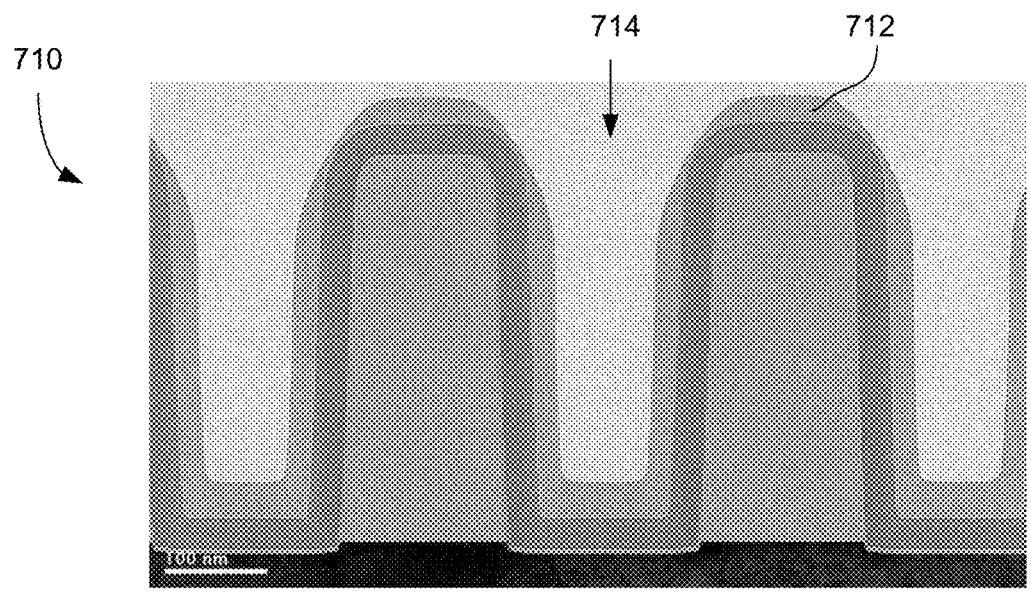

FIG. 7B presents images of test wafer 710 having a layer of silicon oxide 712 deposited thereon. As in FIG. 7A, the test wafer 710 includes trenches 714 that are lined with the silicon oxide 712. The top panel shows the test wafer 710 as-deposited, and the bottom panel shows the test wafer 710 after the wet etching process described above in relation to FIG. 7A. The silicon oxide 712 was deposited according to one embodiment falling in the disclosed process window. In particular, the silicon oxide 712 was deposited at about 495° C., using 6,000 Watts total power divided among four stations, using a 2 second RF exposure time.

Table 3 describes the etching results related to the test wafer 710 shown in FIG. 7B.

TABLE 3

|  | Top | Top Corner | Sidewall | Bottom |
|---|---|---|---|---|
| Thickness as deposited (Å) | 330.4 | 127.4 | 315.8 | 421.0 |
| Thickness after etching (Å) | 257.3 | 54.6 | 248.5 | 356.7 |
| Amount etched (Å) | 73.1 | 72.9 | 67.3 | 64.3 |
| Wet etch rate (WER) (Å/sec) | 0.49 | 0.49 | 0.45 | 0.43 |
| Ratio of WER to WER at feature top | 100% | 100% | 92% | 88% |

In this example, the wet etch rate was much more uniform at the different portions of the trench 714 compared to the results seen in trench 704 of FIG. 7A. The top corners of the trenches 714 were fairly thin, likely due to sputtering during deposition. Such sputtering and thin corners are not particularly problematic in certain contexts, though in other contexts the corner sputtering should be kept to a minimum. The WER is reduced toward the bottom of the feature. In particular, the top and top corner of the feature show about the same WER, which is higher than the WER at the sidewall, which is higher than the WER at the bottom.

Figure 7C:
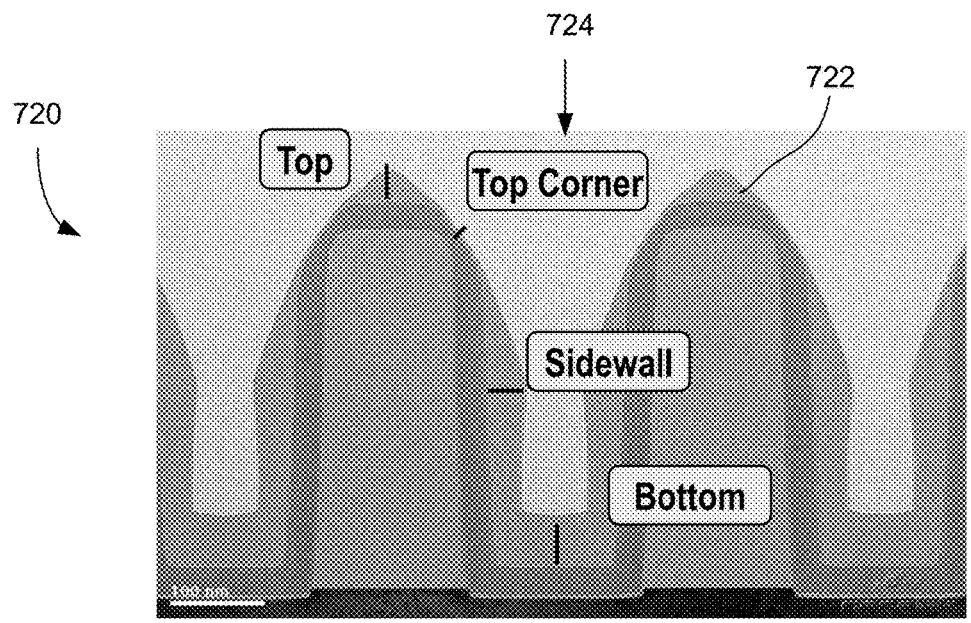
Figure 7C:
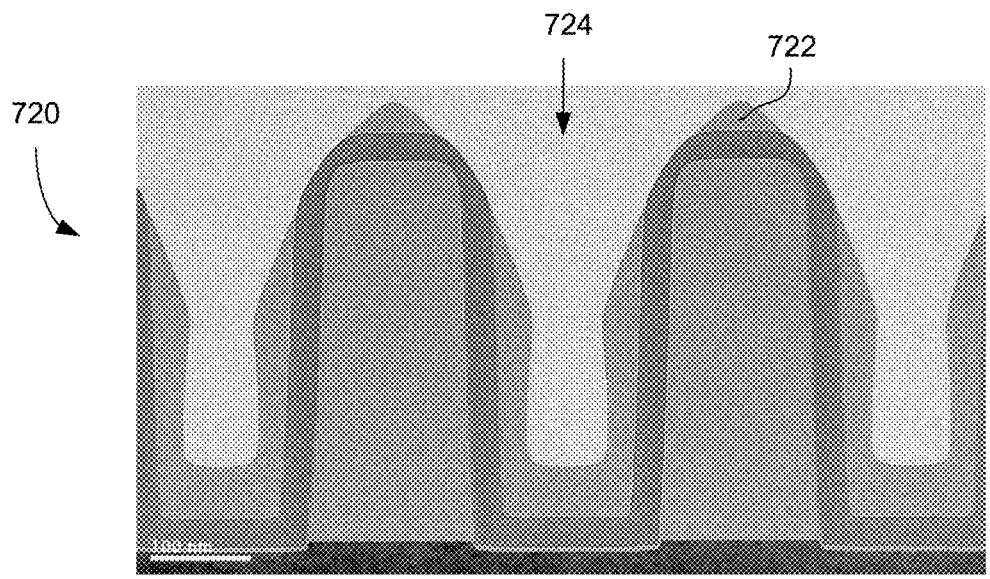

FIG. 7C presents images of test wafer 720 having a layer of silicon oxide 722 deposited thereon. As in FIG. 7A, the test wafer 720 includes trenches 724 that are lined with the silicon oxide 722. The top panel shows the test wafer 720 as-deposited, and the bottom panel shows the test wafer 720 after the wet etching process described above in relation to FIG. 7A. The silicon oxide 722 was deposited according to one embodiment falling in the disclosed process window. In particular, the silicon oxide 722 was deposited at about 495° C., using 6,000 Watts total power divided among four stations, using a 5 second RF exposure time.

Table 4 describes the etching results related to the test wafer 720 shown in FIG. 7C.

TABLE 4

|  | Top | Top Corner | Sidewall | Bottom |
|---|---|---|---|---|
| Thickness as deposited (Å) | 350.9 | 38.4 | 429.8 | 558.5 |
| Thickness after etching (Å) | 298.3 | 0.0 | 380.1 | 520.5 |
| Amount etched (Å) | 52.6 | >38.4 | 49.7 | 38.0 |
| Wet etch rate (WER) (Å/sec) | 0.35 | — | 0.33 | 0.25 |
| Ratio of WER to WER at feature top | 100% | — | 94% | 72% |

As shown in FIG. 7C, the silicon oxide 722 was deposited quite thinly near the top corners of the trench 724. It is believed that strong sputtering occurred during film deposition, both to the silicon oxide and to the underlying silicon nitride. The sidewalls and bottom of the trench 724 are deposited much thicker, suggesting that material sputtered off the top and top corner portions was re-deposited on the sidewall and bottom portions. Because longer RF exposure durations result in increased sputtering, care should be taken to ensure that the RF exposure duration chosen does not over-sputter the film. The optimal RF exposure duration will relate to the particular precursors, flow rates, RF powers, and other factors used during deposition. In this example, the top corner was completely etched during the wet etch process.

Figure 7D:
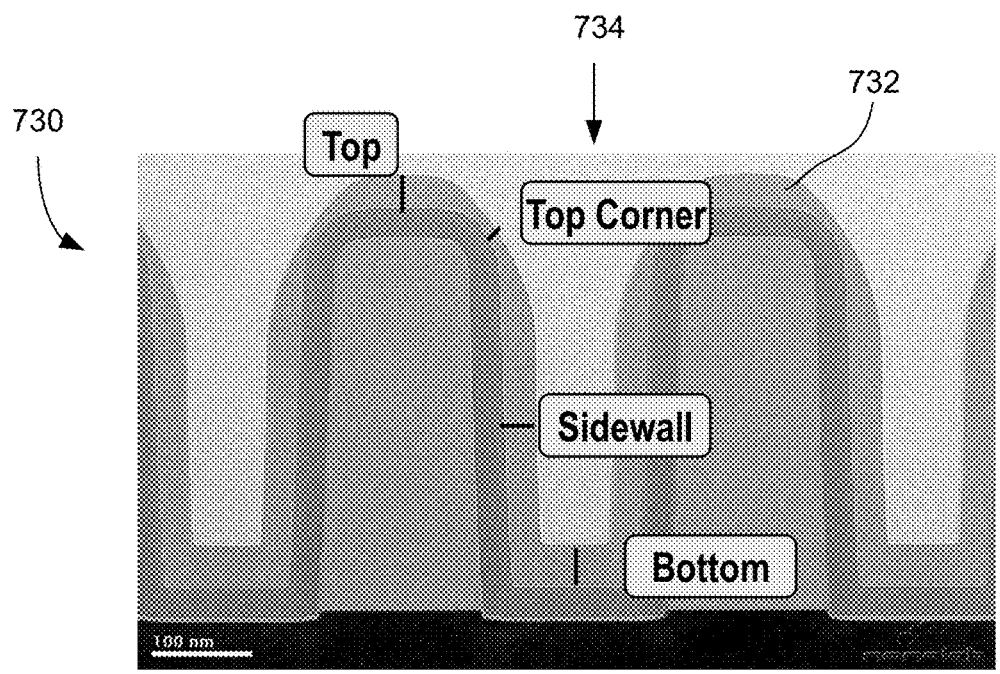
Figure 7D:
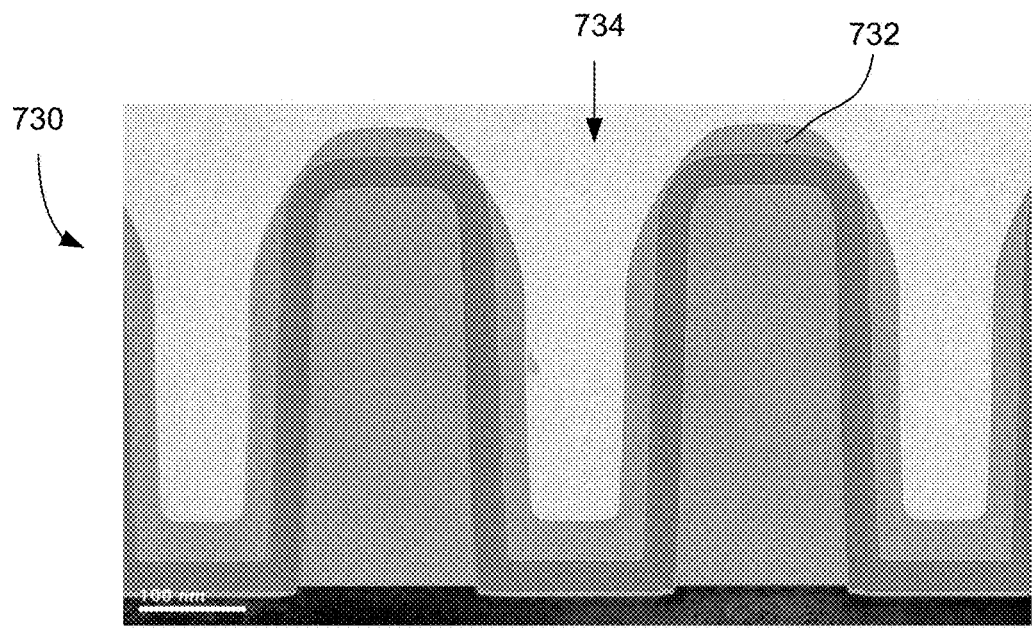

FIG. 7D presents images of test wafer 730 having a layer of silicon oxide 732 deposited thereon. As in FIG. 7A, the test wafer 730 includes trenches 734 that are lined with the silicon oxide 732. The top panel shows the test wafer 730 as-deposited, and the bottom panel shows the test wafer 730 after the wet etching process described above in relation to FIG. 7A. The silicon oxide 732 was deposited according to one embodiment falling in the disclosed process window. In particular, the silicon oxide 732 was deposited at about 495° C., using 6,000 Watts total power divided among four stations, using a 2 second RF exposure time. The silicon oxide 732 was deposited using a helium plasma treatment every 50 ALD cycles.

Table 5 describes the etching results related to the test wafer 720 shown in FIG. 7C.

TABLE 5

|  | Top | Top Corner | Sidewall | Bottom |
|---|---|---|---|---|
| Thickness as deposited (Å) | 333.3 | 102.3 | 315.8 | 429.8 |
| Thickness after etching (Å) | 271.9 | 43.8 | 259.8 | 377.2 |
| Amount etched (Å) | 61.4 | 58.5 | 56.0 | 52.6 |
| Wet etch rate (WER) (Å/sec) | 0.41 | 0.39 | 0.37 | 0.35 |
| Ratio of WER to WER at feature top | 100% | 95% | 91% | 86% |

In this example, the top corners of the silicon oxide film 732 showed signs of sputtering during deposition, though to a lesser extent than the silicon oxide film 722 of FIG. 7C. The wet etch rate decreases toward the bottom of the feature. The top portion of the trench 734 shows the highest WER, followed by the top corner, then the sidewall, and finally the bottom.

Figure 8:
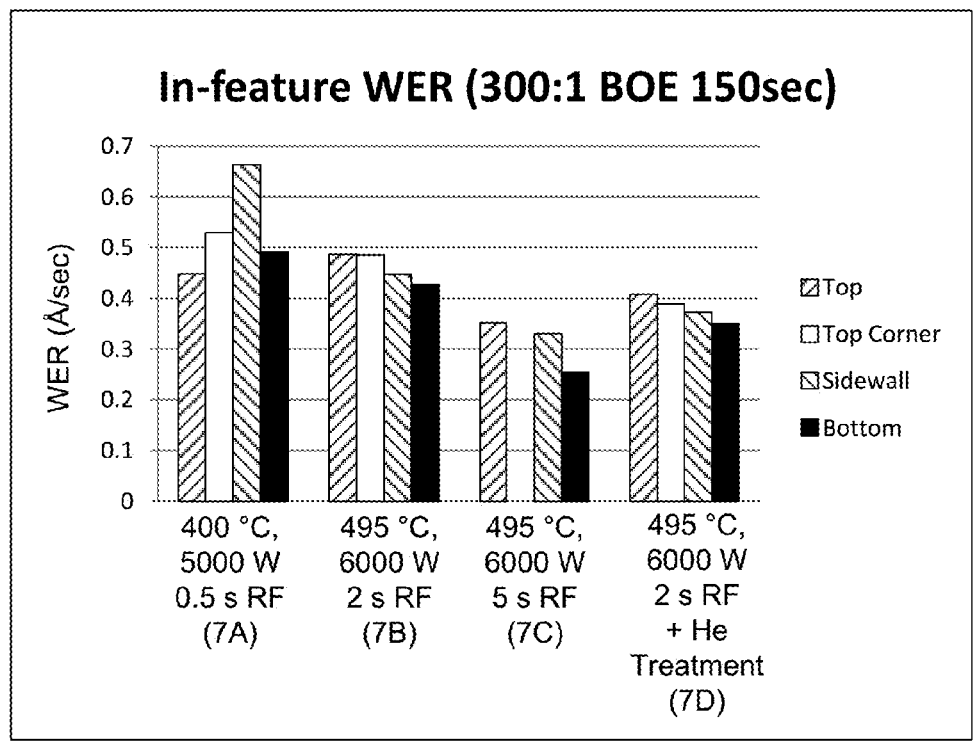
FIG. 8 summarizes the etching results seen in FIGS. 7A-7D.

FIG. 8 summarizes the results shown in FIGS. 7A-7D and Tables 2-5.

What is claimed is:

1. A method of depositing a silicon oxide film on a surface of a substrate in a single or multi-station reaction chamber, the method comprising:
   (a) flowing a silicon-containing reactant in vapor phase into the reaction chamber under conditions allowing the silicon-containing reactant to adsorb onto the surface of the substrate;
   (b) after (a), flowing an oxygen-containing reactant in vapor phase into the reaction chamber, and exposing the surface of the substrate to plasma to drive a surface reaction between the silicon-containing reactant and the oxygen-containing reactant to form the silicon oxide film,
      wherein flowing the oxygen-containing reactant and exposing the surface of the substrate to plasma occur at least partially at the same time,
      wherein a temperature of the substrate is maintained between about 435-550° C. during (a) and (b),
      wherein the plasma is generated using a total RF power between about 2.1-3.6 Watts per square centimeter of substrate area, and
      wherein the surface of the substrate is exposed to the plasma in (b) for a duration between about 2-5 seconds; and
   (c) repeating (a) and (b) until the silicon oxide film reaches a target thickness; and
   (d) periodically exposing the surface of the substrate to a plasma treatment comprising:
      generating a treatment plasma from a treatment plasma generation gas comprising oxygen and argon, wherein a ratio of oxygen:argon in the treatment plasma generation gas is between about 0.5:1 and 2:1, as measured in SLM, and
      exposing the surface of the substrate to the treatment plasma for a duration between about 10-100 seconds to thereby densify the silicon oxide film.

2. The method of claim 1, wherein the silicon oxide film forms in a recessed feature having an aspect ratio of about 10 or higher.

3. The method of claim 2, wherein the recessed feature has a width between about 5-50 µm.

4. The method of claim 3, wherein the recessed feature is a through-silicon-via (TSV).

5. The method of claim 3, wherein the recessed feature forms a portion of a 3D-NAND structure.

6. The method of claim 2, wherein the silicon oxide film exhibits a first wet etch rate at a field region proximate a top opening of the recessed feature, a second wet etch rate at a top corner of the recessed feature, a third wet etch rate at a middle of a sidewall of the recessed feature, and a fourth wet etch rate at a bottom of the recessed feature, wherein the first wet etch rate is equal to or greater than the third wet etch rate.

7. The method of claim 6, wherein the first wet etch rate is equal to or greater than the second wet etch rate, wherein the second wet etch rate is equal to or greater than the third wet etch rate, and wherein the third wet etch rate is equal to or greater than the fourth wet etch rate.

8. The method of claim 6, wherein the first wet etch rate, second wet etch rate, third wet etch rate, and fourth wet etch rate do not differ from one another by more than about 15%.

9. The method of claim 1, further comprising performing a post-reactant purge after the flow of the silicon-containing reactant has ceased, and performing a post-plasma purge after exposing the surface of the substrate to the plasma.

10. The method of claim 9, wherein the silicon-containing reactant is flowed into the reaction chamber for a duration between about 0.2-1 second in (a), wherein the post-reactant purge has a duration between about 0.2-1 second, wherein the oxygen-containing reactant is flowed into the reaction chamber and the surface of the substrate is exposed to plasma for a duration between about 0.5-1 second, and wherein the post-plasma purge has a duration between about 0.1-0.5 seconds.

11. The method of claim 1, wherein the silicon-containing reactant comprises an amino substituted silane, and wherein the oxygen-containing reactant comprises at least one of oxygen, nitrous oxide, ozone, carbon monoxide, nitric oxide, nitrogen dioxide, sulfur oxide, sulfur dioxide, an oxygen-containing hydrocarbon, water, and mixtures thereof.

12. The method of claim 11, wherein the amino substituted silane comprises BTBAS.

13. The method of claim 12, wherein a pressure in the reaction chamber is maintained between about 2-6 Torr during (a) and (b).

14. The method of claim 1, wherein the silicon oxide film has a breakdown voltage between about −7.6 and -12.7 MC/cm.

15. The method of claim 1, wherein the silicon oxide film exhibits a flatband voltage that does not differ by more than about 1.3 V across the substrate.

16. The method of claim 1, wherein the plasma generation gas comprises helium.

17. The method of claim 1, wherein the plasma generation gas flows at a rate between about 5-20 SLM, and wherein a pressure in the reaction chamber is maintained between about 2-6 Torr when the surface of the substrate is exposed to the treatment plasma.

18. The method of claim 1, wherein the treatment plasma is generated using a total RF power between about 0.3-1.8 Watts per square centimeter of substrate area.

19. The method of claim 1, further comprising:
   (d) after (c), flowing a second silicon-containing reactant in vapor phase into the reaction chamber under conditions allowing the second silicon-containing reactant to adsorb onto the surface of the substrate;
   (e) after (d), flowing a second oxygen-containing reactant in vapor phase into the reaction chamber, and exposing the surface of the substrate to a second plasma to drive a surface reaction between the second silicon-containing reactant and the second oxygen-containing reactant to form a secondary silicon oxide film,
      wherein flowing the second oxygen-containing reactant and exposing the surface of the substrate to the second plasma occur at least partially at the same time,
      wherein a temperature of the substrate is maintained below about 400° C. during (d) and (e),
      wherein the second plasma is generated using a total RF power between about 0.7-1.8 Watts per square centimeter of substrate area, the RF power being provided only at high frequency RF,
      wherein the surface of the substrate is exposed to the second plasma in (e) for a duration between about 0.5-1 second; and
   (f) repeating (d) and (e) until the secondary silicon oxide film reaches a second target thickness.

20. A method of forming a silicon oxide bilayer on a semiconductor substrate, the method comprising:
   (a) forming a first layer of silicon oxide on the substrate at a first temperature through a first atomic layer deposition reaction involving a first plasma generated at a first RF power and periodically exposed to the substrate for a first duration, and periodically exposing the substrate to a plasma treatment comprising:
generating a treatment plasma from a treatment plasma generation gas comprising oxygen and argon, wherein a ratio of oxygen:argon in the treatment plasma generation gas is between about 0.5:1 and 2:1, as measured in SLM, and
exposing the substrate to the treatment plasma for a duration between about 10-100 seconds to thereby densify the first layer of silicon oxide; and
(b) forming a second layer of silicon oxide on the first layer of silicon oxide at a second temperature through a second atomic layer deposition reaction, the first layer of silicon oxide and second layer of silicon oxide together forming the silicon oxide bilayer, wherein formation of the second layer of silicon oxide involves a second plasma generated at a second RF power and periodically exposed to the substrate for a second duration, wherein the first temperature is higher than the second temperature, wherein the first RF power is greater than the second RF power, wherein the first duration is greater than the second duration, and wherein the first layer of silicon oxide has a lower wet etch rate than the second layer of silicon oxide.

21. The method of claim 20, wherein a thickness of the first layer of silicon oxide represents about 20% or less of a total thickness of the silicon oxide bilayer.

22. The method of claim 20, wherein the first RF power is between about 2.1-3.6 Watts per square centimeter of substrate area, and wherein the first duration is between about 2-5 seconds.

23. The method of claim 20, wherein the first temperature is between about 435-550° C. and the second temperature is below about 400° C.

* * * * *